United States Patent
Sadaka et al.

(10) Patent No.: US 7,282,402 B2
(45) Date of Patent: Oct. 16, 2007

(54) METHOD OF MAKING A DUAL STRAINED CHANNEL SEMICONDUCTOR DEVICE

(75) Inventors: Mariam G. Sadaka, Austin, TX (US); Alexander L. Barr, Crolles (FR); Dejan Jovanovic, Austin, TX (US); Bich-Yen Nguyen, Austin, TX (US); Voon-Yew Thean, Austin, TX (US); Shawn G. Thomas, Gilbert, AZ (US); Ted R. White, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 294 days.

(21) Appl. No.: 11/093,801

(22) Filed: Mar. 30, 2005

(65) Prior Publication Data

US 2006/0228851 A1     Oct. 12, 2006

(51) Int. Cl.
*H01L 21/8238* (2006.01)
*H01L 21/336* (2006.01)

(52) U.S. Cl. .................. 438/221; 438/197; 438/199; 438/230; 438/202; 438/258; 438/303; 438/207; 438/218; 257/E21.63; 257/E21.631; 257/E21.632; 257/E21.633; 257/E21.634; 257/E21.635; 257/E21.636; 257/E21.637; 257/E21.638; 257/E21.639; 257/E21.64; 257/E21.641; 257/E21.642; 257/E21.643; 257/E21.644

(58) Field of Classification Search ............... 438/197, 438/230, 303, 202, 258, 199, 221, 207, 218; 257/E21.63, E21.631, E21.632, E21.633, 257/E21.634, E21.635, E21.636, E21.637, 257/E21.638, E21.639, E21.64, E21.641, 257/E21.642, E21.643, E21.644

See application file for complete search history.

(56) References Cited

U.S. PATENT DOCUMENTS

| | | | |
|---|---|---|---|
| 5,461,243 A | 10/1995 | Ek et al. | |
| 5,534,713 A | 7/1996 | Ismail et al. | |
| 5,759,898 A | 6/1998 | Ek et al. | |
| 5,846,857 A | 12/1998 | Ju | |
| 5,943,565 A | 8/1999 | Ju | |
| 5,998,807 A | 12/1999 | Lustig et al. | |

(Continued)

FOREIGN PATENT DOCUMENTS

JP     2000243946     12/1999

(Continued)

OTHER PUBLICATIONS

Jung et al., "Implementation of Both High-Hole and Electron Mobility in Strained Si/Strained $Si_{1-y}Ge_y$ on Relaxed $Si_{1-x}Ge_x$ (x<y) Virtual Substrate," *IEEE Electron Device Letters*, vol. 24, No. 7, Jul. 2003, pp. 460-462.

(Continued)

*Primary Examiner*—Walter Lindsay, Jr.
(74) *Attorney, Agent, or Firm*—Micahel J. Balconi-Lamica; David G. Dolezal

(57) ABSTRACT

According to the embodiments to the present disclosure, the process of making a dual strained channel semiconductor device includes integrating strained Si and compressed SiGe with trench isolation for achieving a simultaneous NMOS and PMOS performance enhancement. As described herein, the integration of NMOS and PMOS can be implemented in several ways to achieve NMOS and PMOS channels compatible with shallow trench isolation.

19 Claims, 14 Drawing Sheets

U.S. PATENT DOCUMENTS

| | | | |
|---|---|---|---|
| 6,059,895 | A | 5/2000 | Chu et al. |
| 6,124,627 | A | 9/2000 | Rodder et al. |
| 6,339,232 | B1 | 1/2002 | Takagi |
| 6,369,438 | B1 | 4/2002 | Sugiyama et al. |
| 6,524,935 | B1 | 2/2003 | Canaperi et al. |
| 6,621,131 | B2 | 9/2003 | Murthy et al. |
| 6,638,802 | B1 | 10/2003 | Hwang et al. |
| 6,682,965 | B1* | 1/2004 | Noguchi et al. ............ 438/199 |
| 6,900,502 | B2* | 5/2005 | Ge et al. .................... 257/347 |
| 6,936,506 | B1* | 8/2005 | Buller et al. ................ 438/197 |
| 6,982,433 | B2* | 1/2006 | Hoffman et al. .............. 257/18 |
| 7,101,742 | B2* | 9/2006 | Ko et al. .................... 438/197 |
| 7,112,495 | B2* | 9/2006 | Ko et al. .................... 438/300 |
| 7,217,608 | B1* | 5/2007 | Xiang ........................ 438/199 |
| 2001/0048119 | A1 | 12/2001 | Rodder et al. |
| 2003/0013305 | A1 | 1/2003 | Sugii et al. |
| 2003/0034529 | A1 | 2/2003 | Fitzgerald |
| 2003/0040160 | A1 | 2/2003 | Huang et al. |
| 2004/0195623 | A1* | 10/2004 | Ge et al. .................... 257/347 |
| 2004/0253776 | A1* | 12/2004 | Hoffmann et al. .......... 438/199 |
| 2005/0035369 | A1* | 2/2005 | Lin et al. .................... 257/194 |
| 2005/0035409 | A1* | 2/2005 | Ko et al. .................... 257/350 |
| 2005/0073022 | A1* | 4/2005 | Karlsson et al. ............ 257/510 |
| 2005/0110082 | A1* | 5/2005 | Cheng et al. ................ 257/341 |

FOREIGN PATENT DOCUMENTS

| | | |
|---|---|---|
| WO | WO 02/33746 A1 | 4/2002 |
| WO | WO 02/45156 A2 | 6/2002 |

OTHER PUBLICATIONS

Tezuka et al., "Ultrathin Body SiGe-on-Insulator pMOSFETs With High-Mobility SiGe Surface Channels," *IEEE Transactions on Electron Devices*, vol. 50, No. 5, May 2003, pp. 1328-1333.

Tezuka et al., "Dislocation-free Formation of Relaxed SiGe-on-insulator Layers," *Applied Physics Letters*, May 13, 2002, vol. 80, No. 19, pp. 3560-3562.

Lee et al., "Sub-30 nm P+ abrupt junction formation in Strained Si/$Si_{1-x}Ge_x$ MOS device," *Technical Digest of the International Electron Devices Meeting*, Dec. 8, 2002, pp. 379-381.

Sawano et al., "Relaxation Enhancement of SiGe Thin Layers by Ion Implantation into Si Substrates," *IEEE*, 2002, pp. 403-404.

Lim, Y. S. et al., "Dry Thermal Oxidation of a Graded SiGe Layer", *Applied Physics Letters*, vol. 79, No. 22, Nov. 26, 2001, pp. 3606-3608.

Tezuka et al., "Fabrication of Strained Si on an Ultrathin SiGe-on-insulator Virtual Substrate with a High-Ge Fraction," *Applied Physics Letters*, Sep. 17, 2001, vol. 79, No. 12, pp. 1798-1800.

Vyatkin et al., "Ion Beam Induced Strain Relaxation in Pseudomorphous Epitaxial SiGe Layers," *IEEE*, 2000, pp. 70-72.

Chi et al., "Electrically active defects in surface preamorphized and subsequently RTP-annealed Si and the effect of titanium silicidation," *Proc. 1998 5th International Conference on Solid-State and Integrated Circuit Technology*, , Oct. 21, 1998, Beijing, China, p. 324-327.

LeGoues et al., "Kinetics and Mechanism of Oxidation of SiGe: Dry Versus Wet Oxidation," *Applied Physics Letters*, Feb. 13, 1989, vol. 54, No. 7, pp. 644-646.

LeGoues et al., "Oxidation Studies of SiGe," *Journal of Applied Physics*, Feb. 15, 1989, vol. 65, No. 4, pp. 1724-1728.

Fahey et al., "Point defects and dopant diffusion in silicon," *Reviews of Modern Physics*, Apr. 1989, vol. 61, No. 2, pp. 289-384.

* cited by examiner

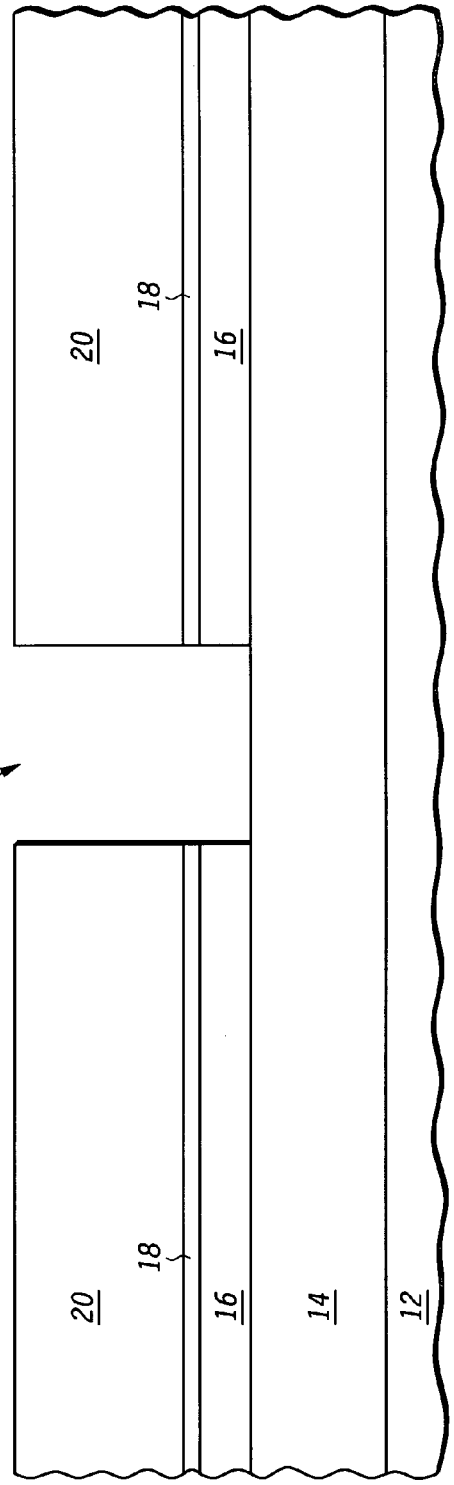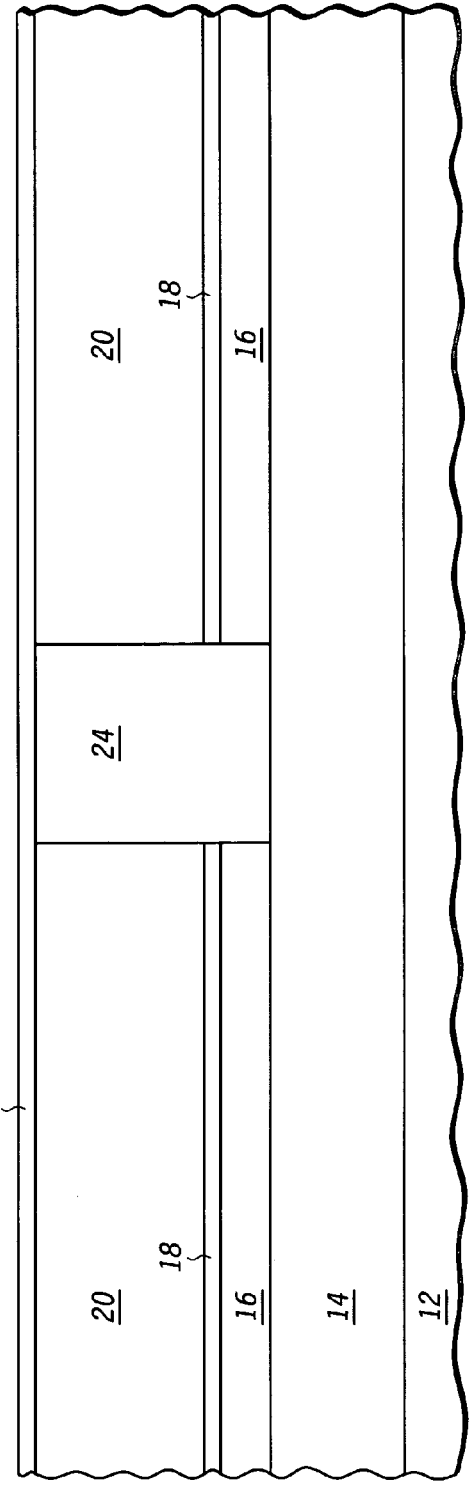

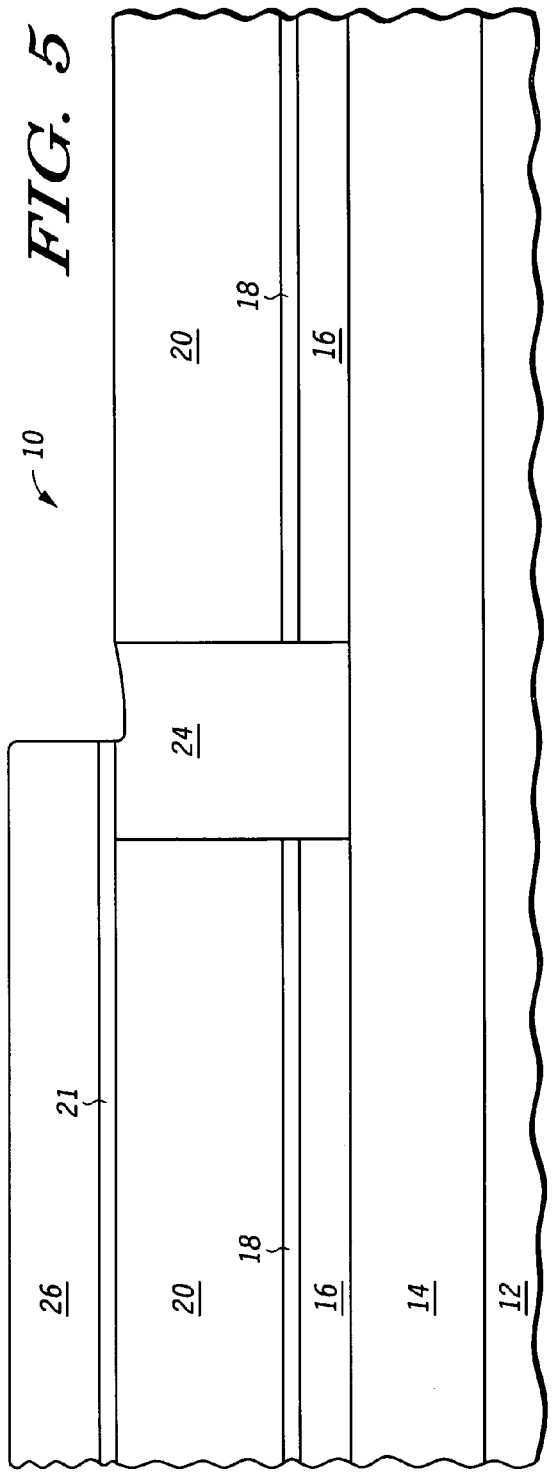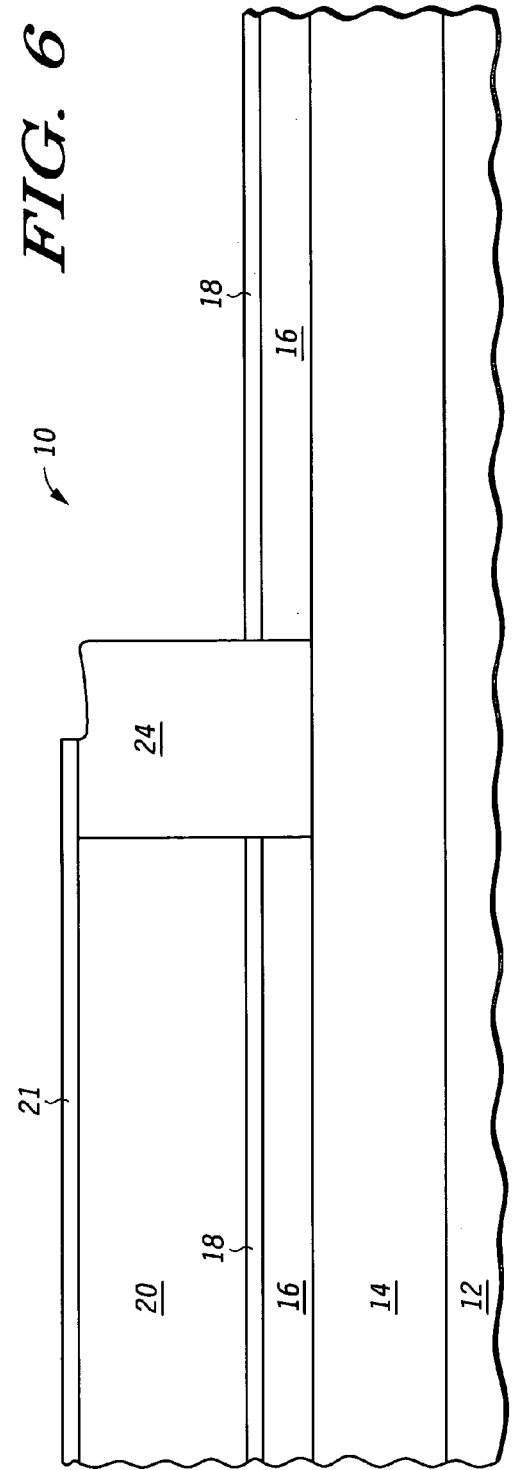

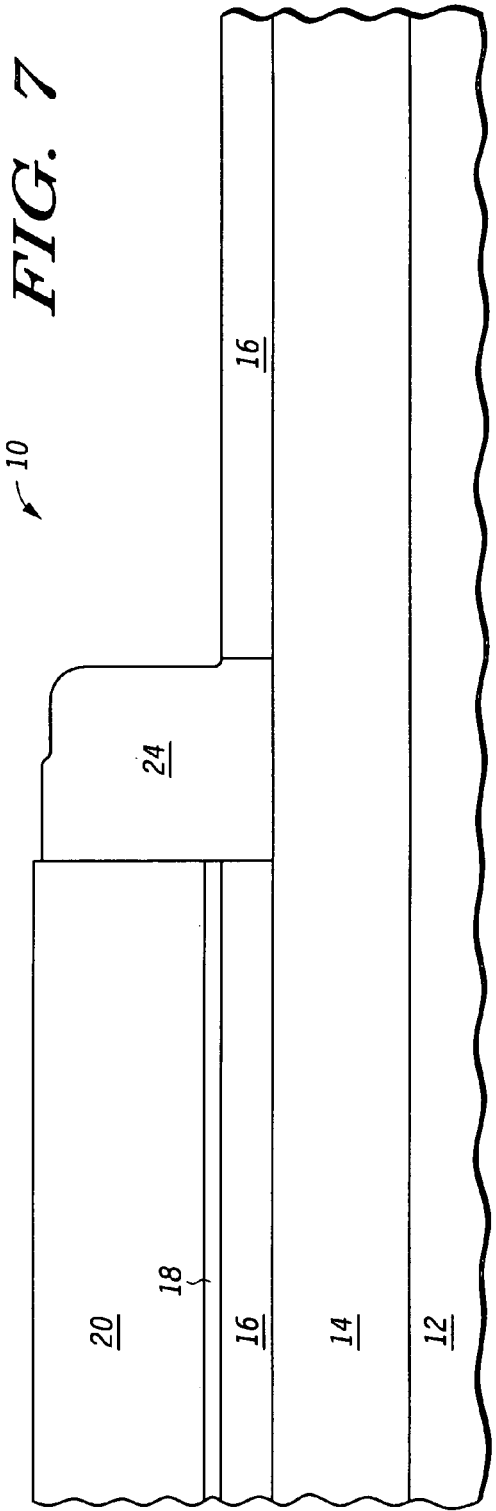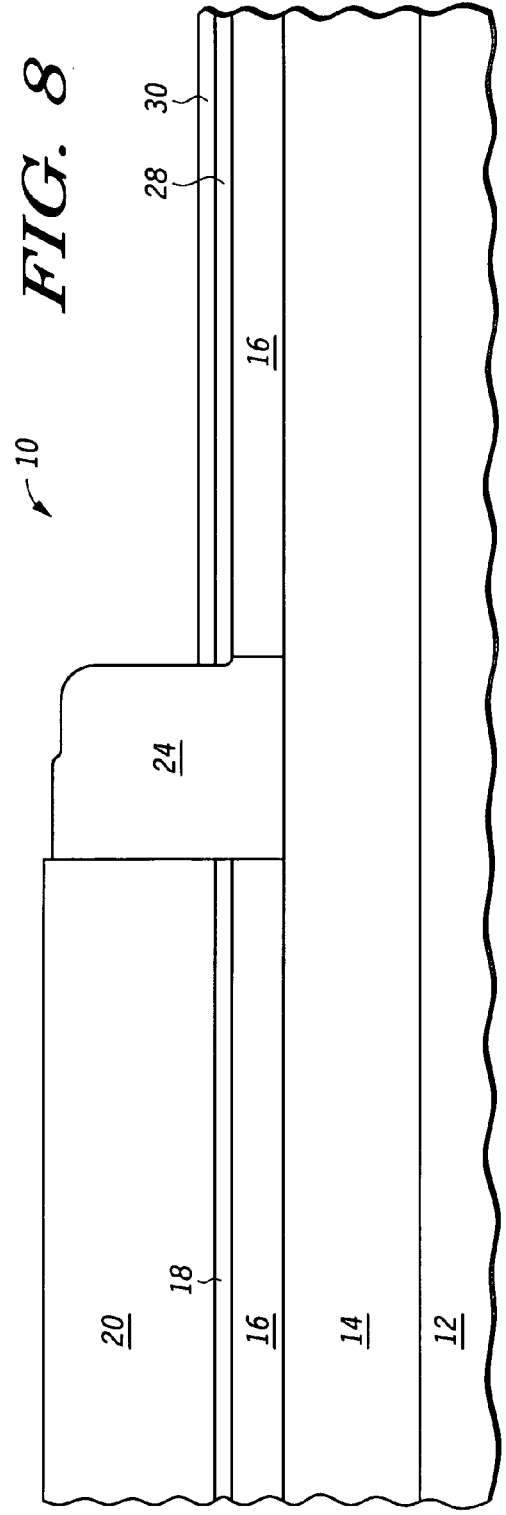

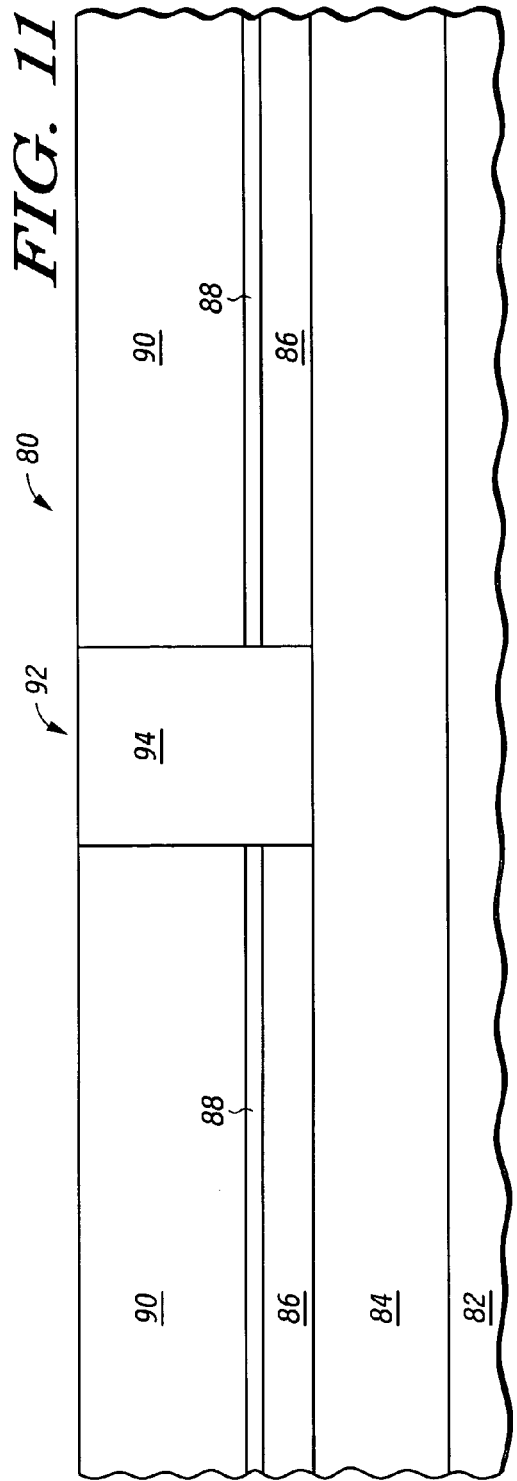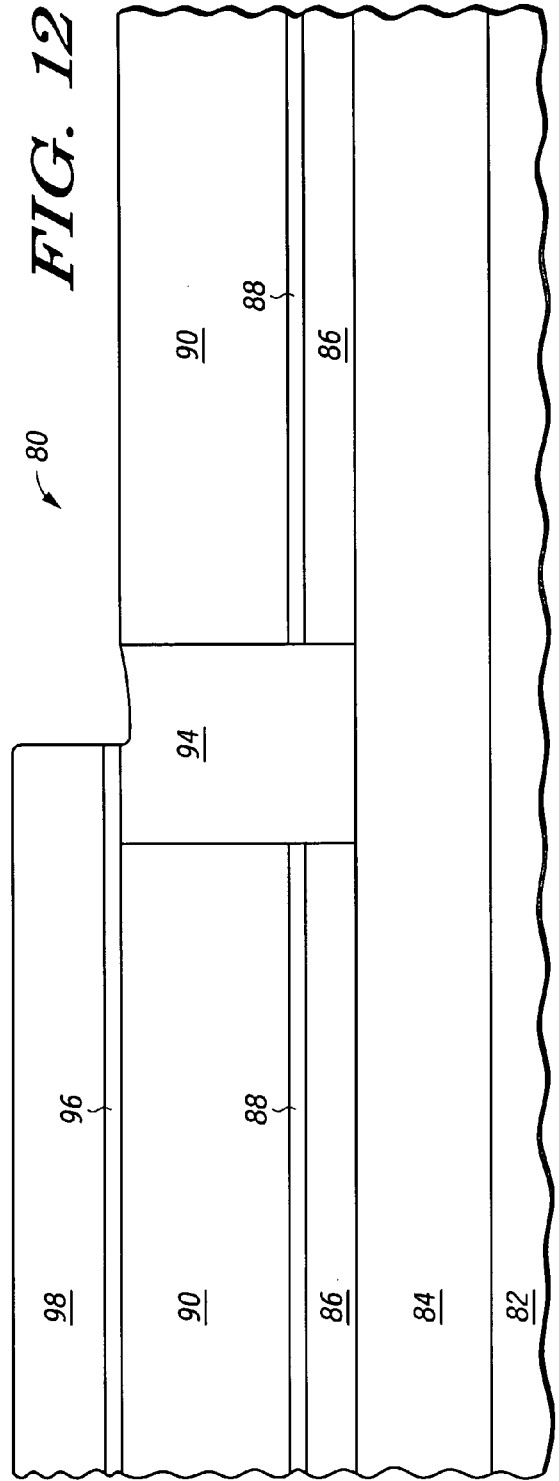

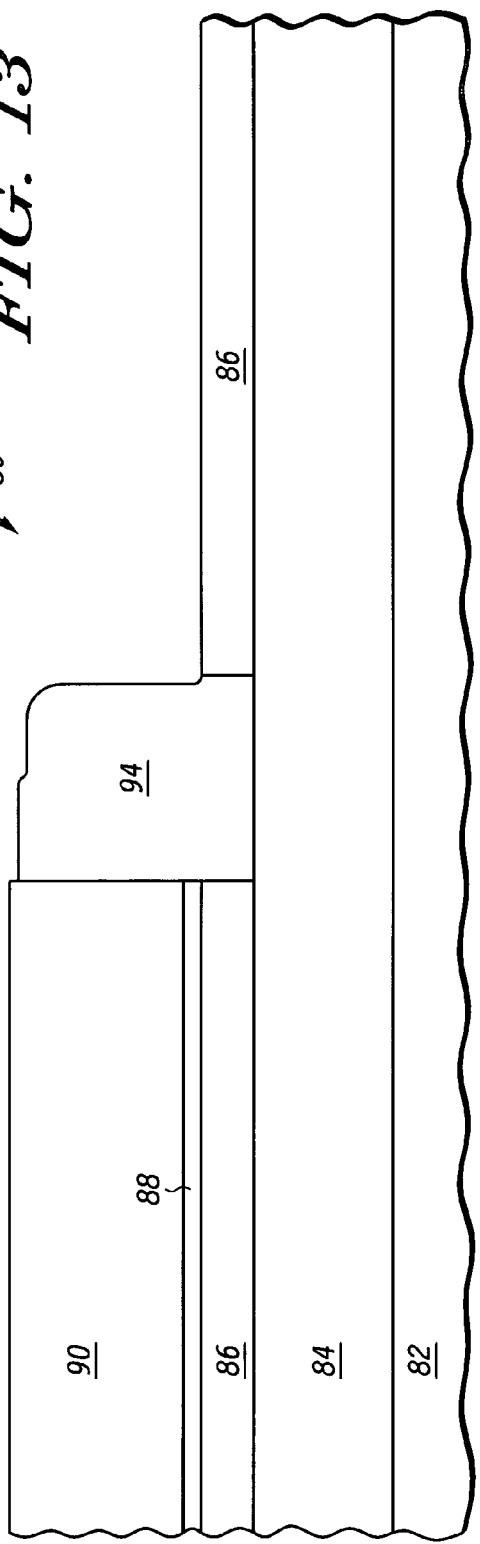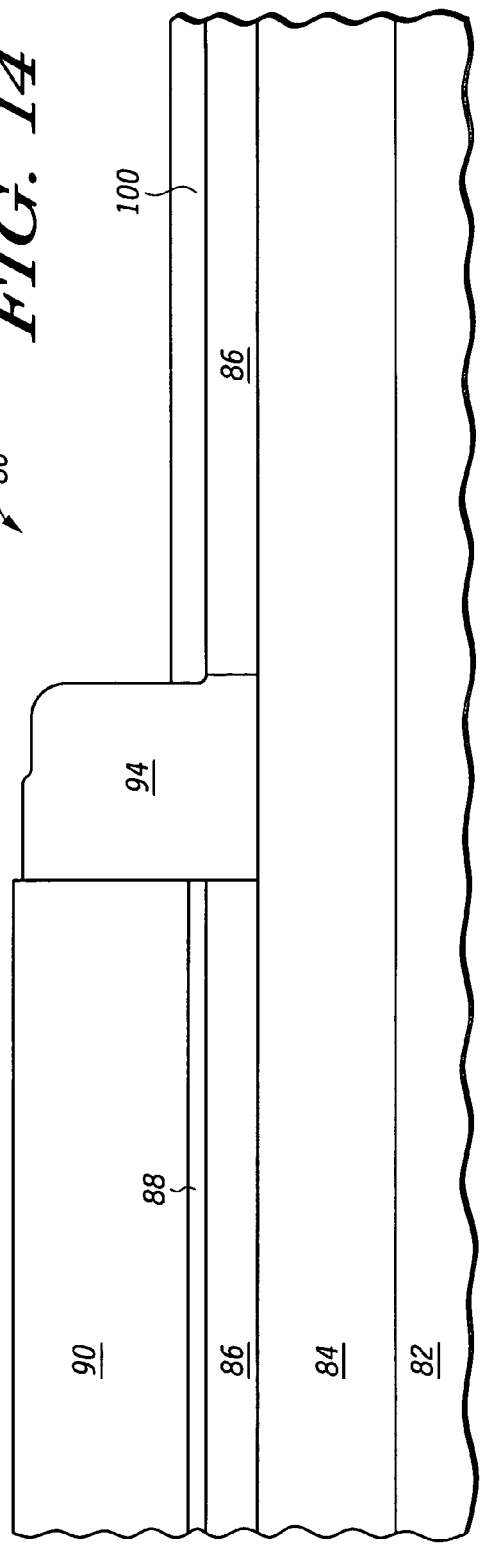

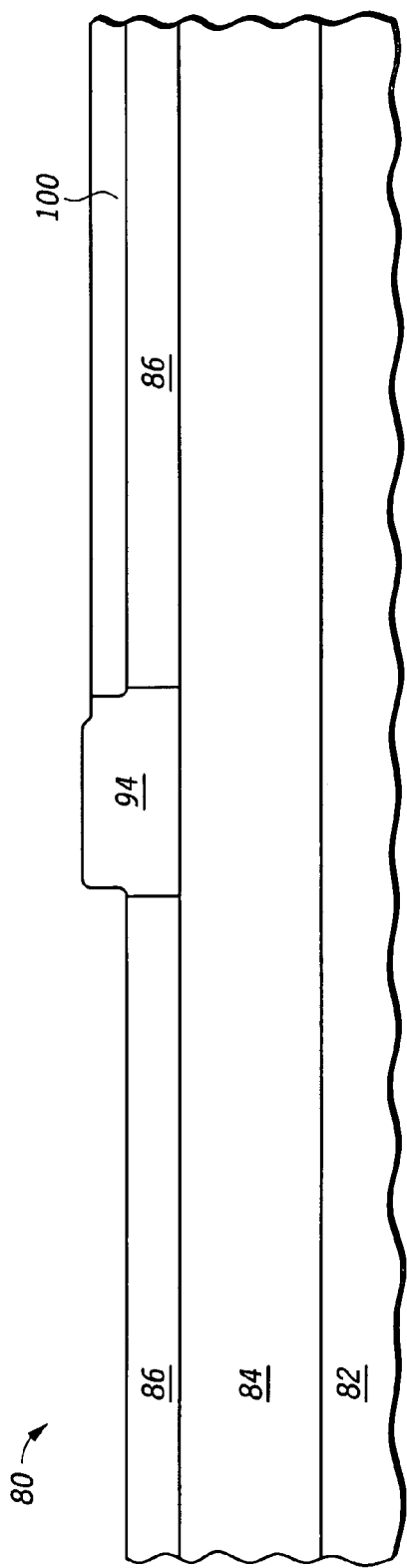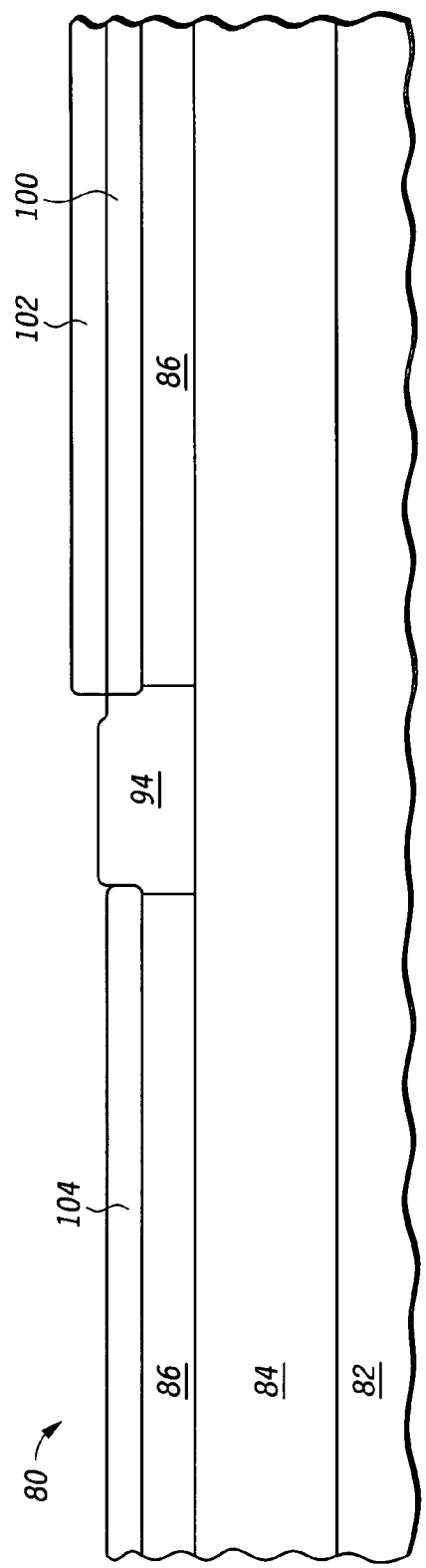

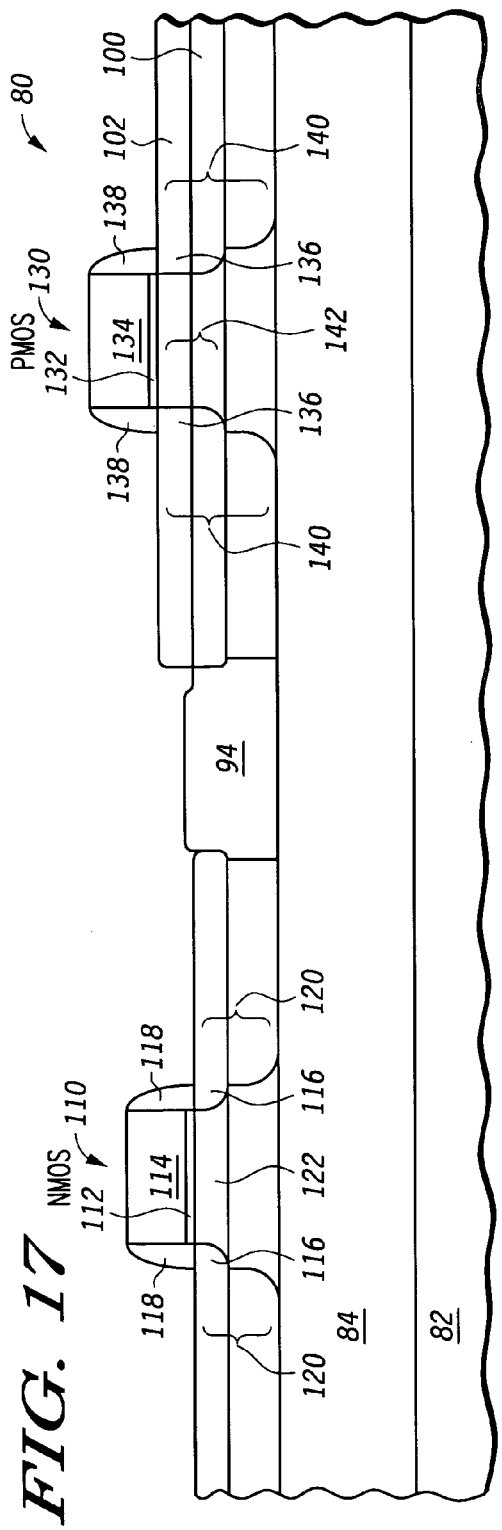
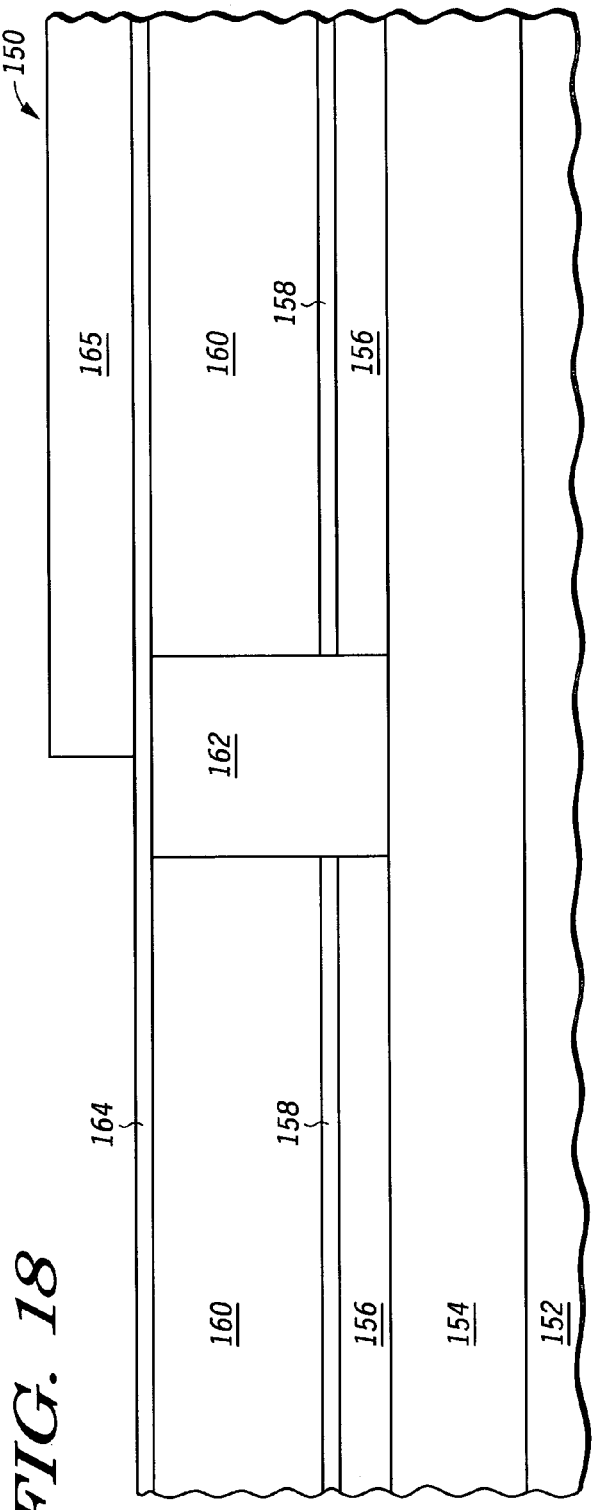

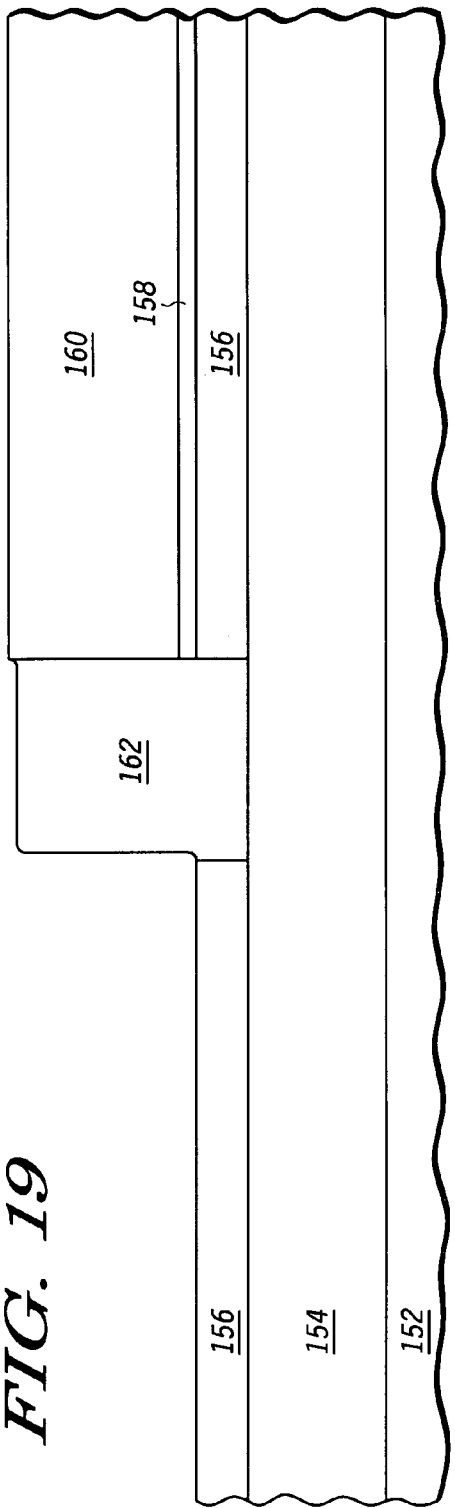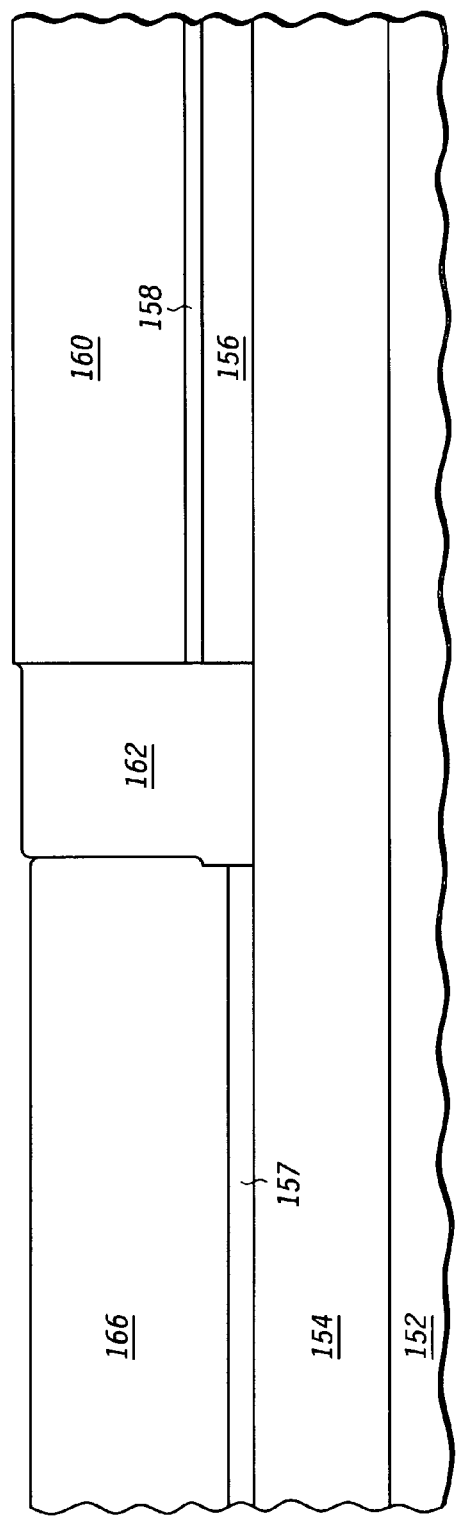

METHOD OF MAKING A DUAL STRAINED CHANNEL SEMICONDUCTOR DEVICE

CROSS-REFERENCE TO CO-PENDING APPLICATIONS

This disclosure relates to co-pending patent application Ser. No. 10/919,952 entitled "Graded Semiconductor Layer," filed on Aug. 17, 2004, and Ser. No. 10/670,928 entitled "SOI Template Layer," filed on Sep. 25, 2004, assigned to the assignee of the present application and incorporated herein by reference.

BACKGROUND

The present disclosure relates generally to semiconductor device manufacturing, and more particularly, to dual strained channel semiconductor devices and methods for making the same.

Integrating NMOS and PMOS devices along with trench isolation where the end result is biaxially, tensile, strained Si used for NMOS channel and biaxially compressed SiGe used for PMOS channel is challenging. Typically, the starting material has either strained Si or compressed SiGe, and so enhancement of NMOS or PMOS takes place separately. Furthermore, the trench isolation module includes high temperature steps that can be detrimental to the degree of tensive or compressive strain in the respective channels.

Prior methods are known for enhancing performance for either PMOS or NMOS alone, but no known methods address simultaneous enhancement for both NMOS and PMOS devices, except for excessively high tensile strain. In one dual channel approach, a SiGe buffer layer is used; however, such an approach is not a dual channel solution for silicon on insulator (SOI). In another approach, wafer bonding is required to achieve tensile and compressive channels on a substrate.

Accordingly, it would be desirable to provide an improved semiconductor device manufacturing method for overcoming the problems in the art.

BRIEF DESCRIPTION OF THE DRAWINGS

The embodiments of the present disclosure are illustrated by way of example and not limited by the accompanying figures, in which like references indicate similar elements, and in which:

FIGS. 1-10 are partial cross-sectional views in a process of making a dual strained channel semiconductor CMOS device according to one embodiment of the present disclosure;

FIGS. 11-17 are partial cross-sectional views in a process of making a dual strained channel semiconductor CMOS device according to another embodiment of the present disclosure;

FIGS. 18-21 are partial cross-sectional views in a process of making a dual strained channel semiconductor CMOS device according to yet another embodiment of the present disclosure;

Figure 1:
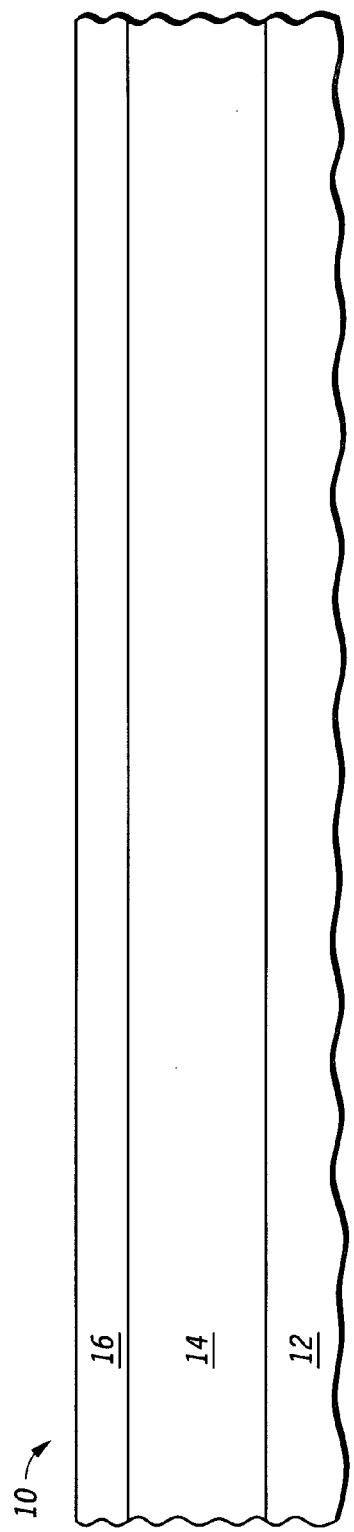

Skilled artisans appreciate that elements in the figures are illustrated for simplicity and clarity and have not necessarily been drawn to scale. For example, the dimensions of some of the elements in the figures may be exaggerated relative to other elements to help improve an understanding of the embodiments of the present disclosure.

DETAILED DESCRIPTION

The embodiments of the present disclosure relate to integrating biaxially tensile Si and biaxially compressed SiGe with trench isolation for achieving an NMOS and PMOS device performance enhancement. Integration of NMOS and PMOS with trench isolation according to the present embodiments achieves simultaneous enhancement in both NMOS and PMOS device performance. Furthermore, the embodiments of the present disclosure achieve biaxially tensile and compressive NMOS and PMOS channels without wafer bonding.

In one embodiment, the process starts with a SOI wafer with a low Ge content SiGe film that is biaxially compressed. Trench isolation is defined first, wherein the trench isolation isolates the PMOS active area from the NMOS active area. By masking the PMOS active area (e.g., the PMOS active area will have a nitride on a pad oxide), condensation with relaxation can be done only on the NMOS region with or without a pad oxide. Condensation provides a relaxed, SiGe-enriched film. Oxide can be etched and a Si cap can be selectively grown to form the biaxially, tensile strained Si channel, or the Si cap deposition can be delayed until after the PMOS channel is defined. For example, after the condensation step, the enriched SiGe can be masked and nitride can be etched from the PMOS active area. At this point, condensation without relaxation can be done again to further enrich the SiGe and provide the compressed channel, or selective, biaxially compressed SiGe can be deposited on top of SiGe to form the PMOS channel. Subsequently, all masking can be removed and a blanket Si film can be deposited to form the strained Si channel in the active NMOS area on top of the relaxed enriched SiGe and the Si can simply cap the biaxially compressed SiGe channel in the PMOS active area. Furthermore, the wafer can then be processed through standard CMOS processes.

The embodiments of the present disclosure can be applied on different starting materials, to include, but not be limited to, biaxially strained Si directly on insulator (SSOI) or a partially relaxed SiGe on insulator (SGOI). In case of the SSOI, the starting substrate already has the biaxial, tensile strained Si channel for NMOS, thus a selective deposition of the compressed SiGe can be done to form the PMOS channel. In case of the SGOI, the starting substrate can have a partially relaxed SiGe channel which can be further enriched by condensation for a more compressed PMOS channel, and/or a partially relaxed channel that can be further relaxed by post oxidation anneals to form the NMOS channel. Alternatively, the SGOI starting substrate can have a fully compressed SiGe channel.

FIGS. 1-10 are cross-sectional views in a process of making a dual, biaxially strained channel semiconductor CMOS device according to one embodiment of the present disclosure. Referring now to FIG. 1, a dual, biaxially strained channel CMOS device 10 is formed beginning with a substrate 12 having a buried oxide (BOX) layer 14 and a biaxial, tensile strained silicon layer 16 overlying the BOX layer 14. Alternatively, forming of device 10 can begin with a biaxial, tensile strained silicon on insulator (SSOI) wafer.

Figure 2:
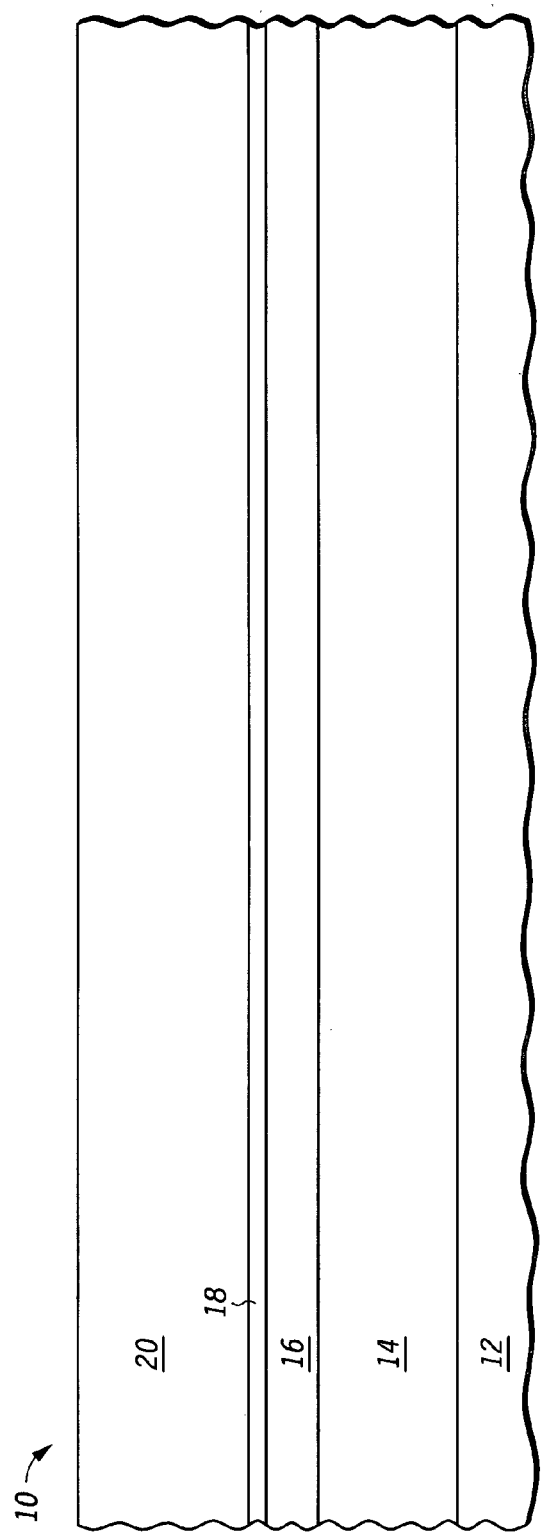

In FIG. 2, a protection layer 18 is formed on biaxial, tensile strained silicon layer 16. Subsequently, a nitride layer 20 is formed on protection layer 18. Protection layer 18 includes, for example, an oxide deposited on biaxial, tensile strained silicon layer 16. Protection layer 18 may also include any other suitable layer for providing protection of the underlying biaxial, tensile strained silicon layer 16 from the overlying nitride layer 20.

In one embodiment, BOX layer 14 has a thickness on the order of less than 2000 Angstroms, biaxial, tensile strained silicon layer 16 has a thickness on the order of less than 1000 Angstroms, protection layer 18 has a thickness on the order of 100 Angstroms, and nitride layer 20 has a thickness on the order of 1200 Angstroms.

Referring now to FIG. 3, a trench opening 22 is formed in layers 20, 18, and 16, wherein the bottom of the trench opening stops on the BOX layer 14. Forming of the trench opening 22 can be accomplished using any suitable etching technique(s) known in the art. Subsequent to forming the trench opening 22, the trench opening is filled with a trench fill material to form shallow trench isolation 24, as shown in FIG. 4. The trench fill can be accomplished using a blanket oxide deposition followed by planarization with chemical-mechanical polishing (CMP). Following the CMP planarization, a thin oxide layer 21 (FIG. 4), on the order of 100 Angstroms, is formed overlying the nitride 20 and shallow trench isolation 24. Oxide layer 21 provides a hardmask for etching of the nitride layer 20 overlying the PMOS region after CMP, as will be discussed further herein below.

Referring now to FIG. 5, a photoresist mask 26 is patterned and etched so that the photoresist mask 26 overlies an NMOS region of device 10 while leaving the PMOS region uncovered. The portion of oxide layer 21 overlying the PMOS region is removed by a suitable etch chemistry to expose the nitride layer 20 overlying the PMOS region of the device. During removal of the portion of oxide layer 21 overlying the PMOS region, a small portion of the trench fill material of shallow trench isolation region 24 is also removed, for example, as shown in FIG. 5.

Mask 26 is then removed using suitable techniques. Subsequent to removing mask 26, nitride layer 20 overlying the PMOS region of device 10 is removed as shown in FIG. 6. Removal of nitride layer 20 overlying the PMOS region can be accomplished by any suitable technique.

Subsequent to removal of nitride layer 20, the method includes simultaneously removing the remaining portions of oxide 21 and removing oxide layer 18 overlying the PMOS region of device 10. During removal of the remaining portion of oxide layer 21 and removing oxide layer 18 overlying the PMOS region, a further small portion of the trench fill material of shallow trench isolation region 24 is also removed, for example, as shown in FIG. 7.

Referring now to FIG. 8, a SiGe layer 28 is selectively grown subsequent to removing the oxide layer 18 overlying the PMOS region. SiGe layer 28 is a biaxially compressed strained SiGe layer, having a thickness less than a critical thickness required to remain a biaxially compressed strained layer. Following the growth of SiGe layer 28, a silicon cap layer 30 is selectively grown over the SiGe layer 28. The silicon cap layer 30 is not strained. Silicon cap layer 30 has a thickness on the order of less than 100 Angstroms.

In one embodiment, the presence of the silicon cap layer 30 is optional. In an alternate embodiment, SiGe layer 28 can be grown thicker with a lower germanium concentration, as compared to a SiGe layer having a higher germanium concentration, wherein the thicker SiGe layer having a lower germanium concentration can then be condensed without relaxation to obtain a biaxially compressed SiGe layer with an optimum strain for enhanced PMOS performance.

During selective growth of the SiGe layer 28 and silicon cap layer 30, nitride layer 20 acts as a mask to provide protection to the underlying NMOS region. In addition, silicon cap layer 30 provides protection for the underlying SiGe layer 28 during further processing as indicated herein.

Figure 9:
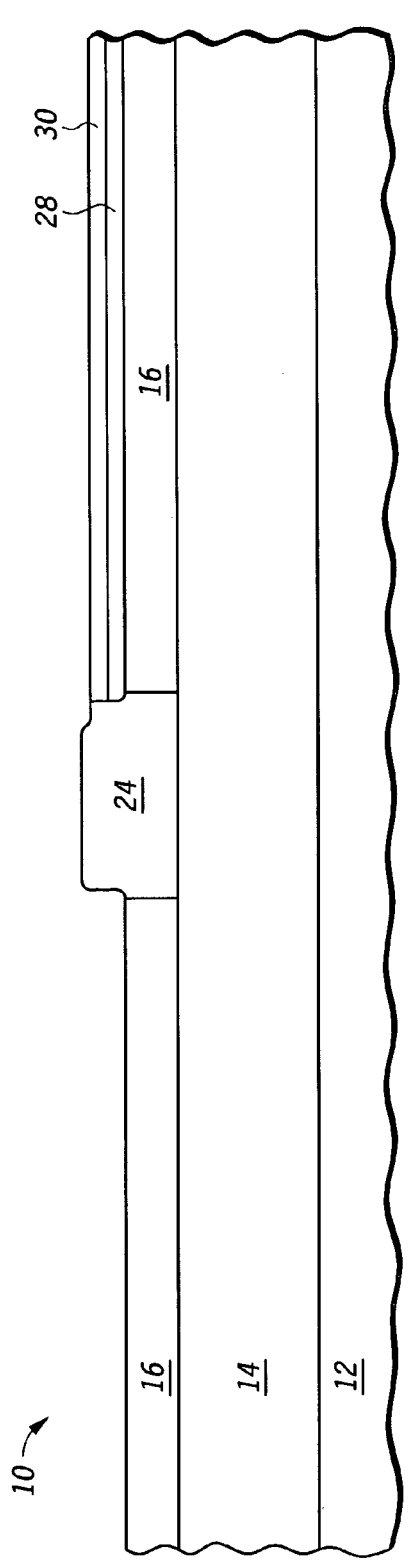

Following formation of layers 28 and 30 in the PMOS region, the nitride layer 20 overlying the NMOS region is removed by a suitable technique(s). Subsequent to removal of nitride layer 20, oxide layer 18 in the NMOS region is removed, for example, via etching. During removal of oxide layer 18, a further portion of shallow trench isolation 24 is removed also, for example, as shown in FIG. 9. The structure as shown in FIG. 9 can then be used to form NMOS and PMOS device structures, either simultaneously or separately, in the respective NMOS and PMOS regions. Accordingly, a method has been provided that enables simultaneous performance enhancement for both NMOS and PMOS device structures.

Figure 10:
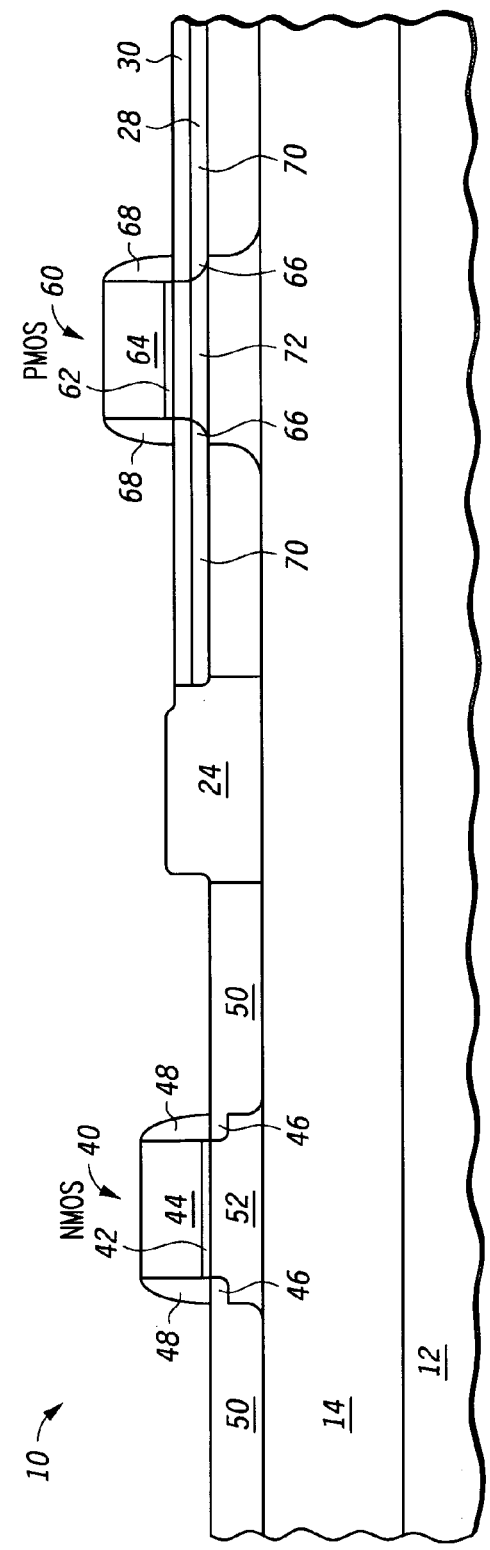

Referring now to FIG. 10, NMOS and PMOS device structures, 40 and 60, respectively, can be formed either simultaneously or separately, in the respective NMOS and PMOS regions using standard CMOS processing techniques. NMOS device structure 40 can include a gate dielectric 42, gate electrode 44, source/drain extension regions 46, sidewall spacers 48 and source/drain implant regions 50. The NMOS device structure 40 has a device channel region indicated by reference numeral 52. PMOS device structure 60 can include a gate dielectric 62, gate electrode 64, source/drain extension regions 66, sidewall spacers 68 and source/drain implant regions 70. The PMOS device structure 60 has a device channel region indicated by reference numeral 72. Trench isolation 24 separates and isolates NMOS device 40 from PMOS device 60.

FIGS. 11-17 are cross-sectional views in a process of making a dual, biaxially strained channel semiconductor CMOS device according to another embodiment of the present disclosure. Referring now to FIG. 11, according to another embodiment, a dual, biaxially strained channel CMOS device 80 is formed beginning with a substrate 82 having a buried oxide (BOX) layer 84 and a partially relaxed silicon germanium (r-SiGe) layer 86 overlying the BOX layer 84. In one embodiment, partially relaxed silicon germanium layer includes, for example, $Si_{1-y}Ge_y$, where y is approximately twenty percent (20%). Alternatively, forming of device 80 can begin with a relaxed silicon germanium on insulator (SGOI) wafer. A protection layer 88 is formed on r-SiGe layer 86. Subsequently, a nitride layer 90 is formed on protection layer 88. Protection layer 88 includes, for example, an oxide deposited on r-SiGe layer 86. Protection layer 88 may also include any other suitable layer for providing protection of the underlying r-SiGe layer 86 from the overlying nitride layer 90.

In one embodiment, BOX layer 84 has a thickness on the order of less than 2000 Angstroms, r-SiGe layer 86 has a thickness on the order of less than 1000 Angstroms, protection layer 88 has a thickness on the order of 100 Angstroms, and nitride layer 90 has a thickness on the order of 1200 Angstroms.

Referring still to FIG. 11, a trench opening (in a region indicated by arrow 92) is formed in layers 90, 88, and 86, wherein a bottom of the trench opening stops on the BOX layer 84. Forming of the trench opening 92 can be accomplished using any suitable etching technique(s) known in the art. Subsequent to forming the trench opening 92, the trench opening is filled with a trench fill material to form shallow trench isolation 94. The trench fill can be accomplished using a blanket oxide deposition followed by planarization with chemical-mechanical polishing (CMP).

Referring now to FIG. 12, following the CMP planarization, a thin oxide layer 96, on the order of 100 Angstroms, is formed overlying the nitride 90 (in both NMOS and PMOS regions) and shallow trench isolation 94. Oxide layer 96 provides a hardmask for etching of the nitride layer 90 overlying the PMOS region after CMP, as will be discussed further herein below. A photoresist mask 98 is then patterned and etched, wherein the photoresist mask 98 overlies the NMOS region of device 80 while leaving the PMOS region uncovered. The portion of oxide layer 96 overlying the PMOS region is removed by any suitable etch chemistry, to expose the nitride layer 90 overlying the PMOS region of the device. During removal of the portion of oxide layer 96 overlying the PMOS region, a small portion of the trench fill material of shallow trench isolation region 94 is also removed, for example, as shown in FIG. 12.

Mask 98 is then removed using suitable techniques. Subsequent to removing mask 98, nitride layer 90 overlying the PMOS region of device 80 is removed as shown in FIG. 13. Removal of nitride layer 90 overlying the PMOS region can be accomplished by any suitable technique. Subsequent to removal of nitride layer 90, the method includes removing the remaining portions of oxide 96 and removing oxide layer 88 overlying the PMOS region of device 80. During removal of the remaining portion of oxide layer 96 overlying the NMOS region and removing oxide layer 88 overlying the PMOS region, a further small portion of the trench fill material of shallow trench isolation region 94 is also removed, for example, as shown in FIG. 13.

Referring now to FIG. 14, a SiGe layer 100 is selectively grown subsequent to removing the oxide layer 88 overlying the PMOS region. In particular, layer 100 is a biaxially, compressively strained SiGe (c-SeGe) layer having a thickness less than a critical thickness required to remain a strained layer. Following the growth of c-SiGe layer 100, a silicon cap layer (not shown) can be selectively grown over the c-SiGe layer 100. The silicon cap layer has a thickness on the order of less than 100 Angstroms. The Si cap layer has biaxial, tensile strain. In one embodiment, the presence of the silicon cap layer is optional. During selective growth of the c-SiGe layer 100 (and the optional silicon cap layer, if applicable), nitride layer 90 acts as a mask to provide protection to the underlying NMOS region.

Following formation of c-SiGe layer 100 in the PMOS region, remaining portion of the nitride layer 90 overlying the NMOS region is removed by a suitable technique(s). Subsequent to removal of nitride layer 90, oxide layer 88 in the NMOS region is removed, for example, via etching. During removal of oxide layer 88, a further portion of shallow trench isolation 94 is removed also, for example, as shown in FIG. 15.

Subsequent to removal of oxide layer 88, a silicon cap layer is selectively grown over the r-SiGe layer 86 in the NMOS region as indicated by reference numeral 104 and over the c-SiGe layer 100 in the PMOS region as indicated by reference numeral 102. The silicon cap layers 102 and 104 have biaxial, tensile strain. The silicon cap layer 102 has a first level of biaxial, tensile strain and the silicon cap layer 104 has a second level of biaxial, tensile strain, wherein the second level of biaxial, tensile strain is more than the first level of biaxial, tensile strain. Furthermore, silicon cap layers 102 and 104 have a thickness on the order of 150-200 Angstroms. Accordingly, simultaneous performance enhancement for both NMOS and PMOS device structures can be achieved. The structure as shown in FIG. 16 is then used to form NMOS and PMOS device structures, either simultaneously or separately, in the respective NMOS and PMOS regions.

Referring now to FIG. 17, NMOS and PMOS device structures, 110 and 130, respectively, can be formed either simultaneously or separately, in the respective NMOS and PMOS regions using standard CMOS processing techniques. NMOS device structure 110 can include a gate dielectric 112, gate electrode 114, source/drain extension regions 116, sidewall spacers 118 and source/drain implant regions 120. Note that the source/drain implant regions 120 extend through the t-Si layer 104 and the r-SiGe layer 86. The NMOS device structure 110 has a device channel region indicated by reference numeral 122.

PMOS device structure 80 can include a gate dielectric 132, gate electrode 134, source/drain extension regions 136, sidewall spacers 138 and source/drain implant regions 140. Note that the source/drain implant regions 140 extend through the Si cap layer 102, the c-SiGe layer 100, and the r-SiGe layer 86. Note that the channel region 142 extends through the Si layer 102 and the c-SiGe layer 100. The PMOS device structure 80 has a device channel region indicated by reference numeral 142. Trench isolation 94 separates and isolates NMOS device 110 from PMOS device 130.

FIGS. 18-21 are cross-sectional views in a process of making a dual strained channel semiconductor CMOS device according to yet another embodiment of the present disclosure. Referring now to FIG. 18, according to another embodiment, a dual strained channel CMOS device 150 is formed beginning with a substrate 152 having a buried oxide (BOX) layer 154 and a partially relaxed silicon germanium layer 156 overlying the BOX layer 154. Alternatively, forming of device 150 can begin with a partially relaxed silicon germanium on insulator (partially relaxed SGOI) wafer. A protection layer 158 is formed on the partially relaxed SiGe layer 156. Subsequently, a nitride layer 160 is formed on protection layer 158. Protection layer 158 includes, for example, an oxide deposited on the partially relaxed SiGe layer 156. Protection layer 158 may also include any other suitable layer for providing protection of the underlying partially relaxed SiGe layer 156 from the overlying nitride layer 160.

In one embodiment, BOX layer 154 has a thickness on the order of less than 2000 Angstroms, partially relaxed SiGe layer 156 has a thickness on the order of less than 1000 Angstroms, protection layer 158 has a thickness on the order of 100-150 Angstroms, and nitride layer 160 has a thickness on the order of 1200 Angstroms. Furthermore, in one embodiment, partially relaxed SiGe layer 156 includes a partially relaxed SiGe layer with a Ge concentration on the order of approximately twenty percent (20%).

Referring still to FIG. 18, a trench opening (not shown) is formed in layers 160, 158, and 156, wherein a bottom of the trench opening stops on the BOX layer 154. Forming of the trench opening can be accomplished using any suitable etching technique(s) known in the art. Subsequent to forming the trench opening, the trench opening is filled with a trench fill material to form shallow trench isolation 162. The trench fill can be accomplished using a blanket oxide deposition followed by planarization with chemical-mechanical polishing (CMP).

Following the CMP planarization, a thin oxide layer 164, on the order of 100-150 Angstroms, is formed overlying the nitride 160 (in both NMOS and PMOS regions) and shallow trench isolation 162. Oxide layer 164 provides a hardmask for etching of the nitride layer 160 overlying the NMOS region after CMP, as will be discussed further herein below. A photoresist mask 165 is then patterned and etched, wherein the photoresist mask 165 overlies the PMOS region of device 80 while leaving the NMOS region uncovered.

The portion of oxide layer 164 overlying the NMOS region is then removed by any suitable etch chemistry, to expose the nitride layer 160 overlying the NMOS region of the device. During removal of the portion of oxide layer 164 overlying the NMOS region, a small portion of the trench fill material of shallow trench isolation region 162 is also removed. Mask 165 is then removed using suitable techniques. Subsequent to removing mask 165, nitride layer 160 overlying the NMOS region of device 150 is removed. Removal of nitride layer 160 overlying the NMOS region can be accomplished by any suitable technique. Subsequent to removal of nitride layer 160, the method includes removing the remaining portions of oxide 164 and removing oxide layer 158 overlying the NMOS region of device 150. During removal of the remaining portion of oxide layer 164 and removing oxide layer 158 overlying the NMOS region, a further small portion of the trench fill material of shallow trench isolation region 162 is also removed, for example, as shown in FIG. 19.

Referring now to FIGS. 19 and 20, the exposed partially relaxed SiGe layer 156 (FIG. 19) in the NMOS region is processed by condensation. Condensation provides a relaxed SiGe enriched layer 157 (FIG. 20) as well as growth of an oxide layer 166 overlying the NMOS region. In particular, layer 157 is relaxed SiGe enriched layer having a thickness on the order of approximately 300 Angstroms. In one embodiment, oxide layer 166 has a thickness on the order of 1500-2000 Angstroms. During condensation and formation of the relaxed SiGe enriched layer 157, nitride layer 160 acts as a mask to provide protection to the underlying PMOS region.

Following formation of relaxed SiGe enriched layer 157 in the NMOS region, the nitride layer 160 overlying the PMOS region is removed by a suitable technique(s). Subsequent to removal of nitride layer 160, the method includes removing the remaining portions of oxide 158 and removing oxide layer 166 overlying the NMOS region of device 150. During removal of the remaining portion of oxide layer 158 and removing oxide layer 166 overlying the NMOS region, a portion of the trench fill material of shallow trench isolation region 162 is also removed, for example, as shown in FIG. 21.

Subsequent to removal of oxide layer 158 and layer 166, a silicon cap layer is selectively grown over the relaxed SiGe enriched layer 157 in the NMOS region as indicated by reference numeral 170 and over the partially relaxed SiGe layer 156 in the PMOS region as indicated by reference numeral 168. The silicon cap layers 168 and 170 have biaxial, tensile strain. The silicon cap layer 168 has a first level of biaxial, tensile strain and the silicon cap layer 170 has a second level of biaxial, tensile strain, wherein the second level of biaxial, tensile strain is more than the first level of biaxial, tensile strain. Furthermore, silicon cap layers 168 and 170 have a thickness on the order of 150-200 Angstroms. Accordingly, another embodiment has been provided that enables a process for simultaneous performance enhancement for both NMOS and PMOS device structures.

Figure 21:
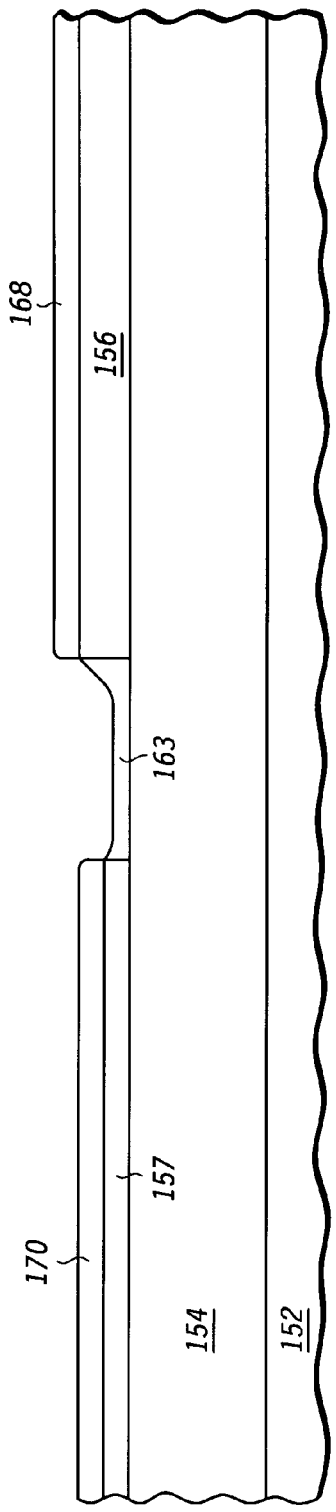

The structure as shown in FIG. 21 is then used to form NMOS and PMOS device structures, either simultaneously or separately, in the respective NMOS and PMOS regions, similarly as discussed herein above with respect to FIGS. 10 and 17. Formation of NMOS and PMOS device structures in the respective NMOS and PMOS regions can be accomplished using standard CMOS processing techniques. The NMOS device structure will have source/drain implant regions that extend through the t-Si layer 170 and the r-SiGe layer 157. The NMOS device structure will also have a device channel region that extends through the t-Si layer 170. The PMOS device structure will have source/drain implant regions that extend through the t-Si layer 168 and partially relaxed SiGe layer 156. In addition, the PMOS device structure will also have a channel region that extends through the t-Si layer 168 and the partially relaxed SiGe layer 156. Trench isolation 163 will separate and isolate the NMOS device from the PMOS device.

Figure 22:
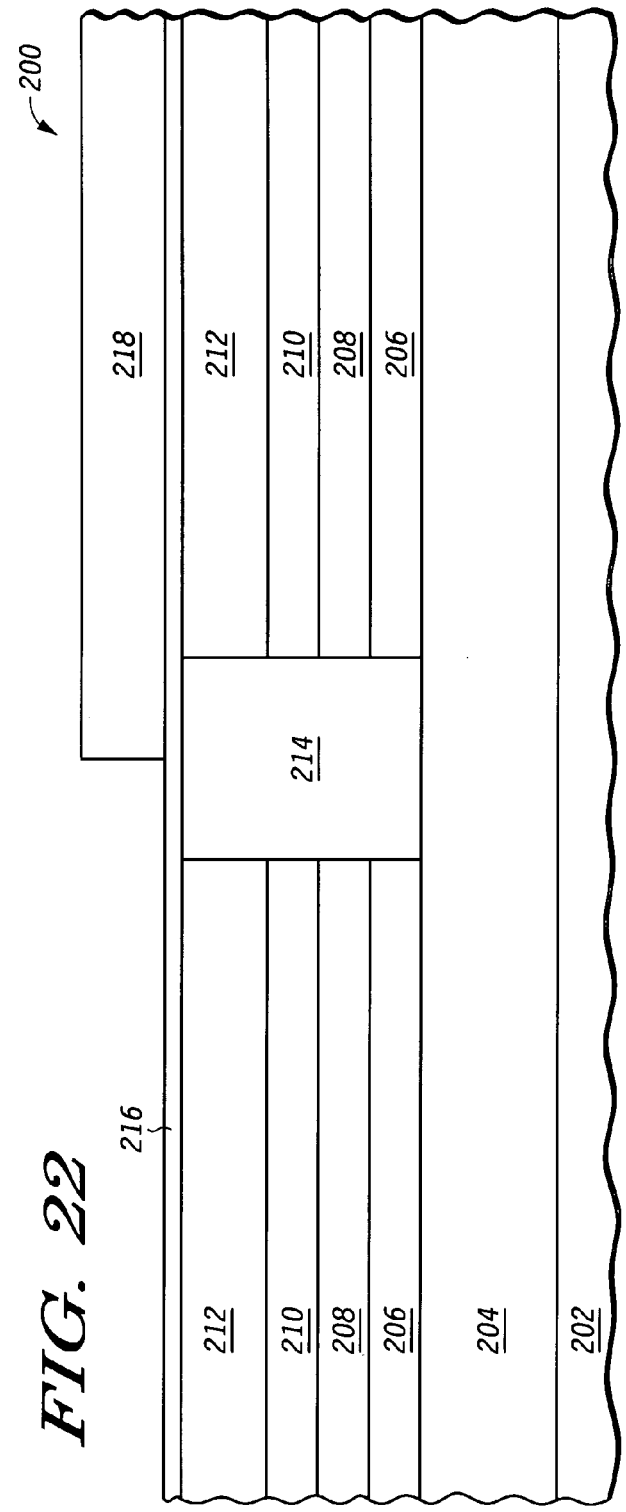
FIGS. 22-26 are partial cross-sectional views in a process of making a dual strained channel semiconductor CMOS device according to yet another embodiment of the present disclosure.

FIGS. 22-26 are cross-sectional views in a process of making a dual strained channel semiconductor CMOS device according to yet another embodiment of the present disclosure. Referring now to FIG. 22, according to yet another embodiment, a dual strained channel CMOS device 200 is formed beginning with a substrate 202 having a buried oxide (BOX) layer 204, a silicon layer 206 overlying the BOX layer 204, and a compressively strained silicon germanium (c-SiGe) layer 208. Alternatively, forming of device 200 can begin with a silicon-germanium on insulator (SGOI) wafer or a SOI wafer with a low Ge content SiGe film ($Si_{1-x}Ge_x$, where $0<x<15\%$). A protection layer 210 is formed on the c-SiGe layer 208. Subsequently, a nitride layer 212 is formed on protection layer 210. Protection layer 210 includes, for example, an oxide deposited on the c-SiGe layer 208. Protection layer 210 may also include any other suitable layer for providing protection of the underlying c-SiGe layer 208 from the overlying nitride layer 212.

In one embodiment, BOX layer 204 has a thickness on the order of less than 2000 Angstroms, Si layer 206 has a thickness on the order of less than 250 Angstroms, c-SiGe layer 208 has a thickness on the order of less than 1000 Angstroms, protection layer 210 has a thickness on the order of 100-150 Angstroms, and nitride layer 160 has a thickness on the order of 1200 Angstroms. Furthermore, in one embodiment, c-SiGe layer 208 includes a compressively strained SiGe layer with a Ge concentration on the order of approximately fifteen percent (15%).

Referring still to FIG. 22, a trench opening (not shown) is formed in layers 212, 210, 208, and 206, wherein a bottom of the trench opening stops on the BOX layer 204. Forming of the trench opening can be accomplished using any suitable etching technique(s) known in the art. Subsequent to forming the trench opening, the trench opening is filled with a trench fill material to form shallow trench isolation 214. The trench fill can be accomplished using a blanket oxide deposition followed by planarization with chemical-mechanical polishing (CMP).

Following the CMP planarization, a thin oxide layer 216, on the order of 100-150 Angstroms, is formed overlying the nitride 212 (in both NMOS and PMOS regions) and shallow trench isolation 214. Oxide layer 216 provides a hardmask for etching of the nitride layer 212 overlying the NMOS region after CMP, as will be discussed further herein below. A photoresist mask 218 is then patterned and etched, wherein the photoresist mask 218 overlies the PMOS region of device 200 while leaving the NMOS region uncovered.

The portion of oxide layer 216 overlying the NMOS region is then removed by any suitable etch chemistry, to expose the nitride layer 212 overlying the NMOS region of the device. During removal of the portion of oxide layer 216 overlying the NMOS region, a small portion of the trench fill material of shallow trench isolation region 214 is also removed. Mask 218 is then removed using suitable techniques. Subsequent to removing mask 218, nitride layer 212 overlying the NMOS region of device 200 is removed. Removal of nitride layer 212 overlying the NMOS region can be accomplished by any suitable technique. Subsequent to removal of nitride layer 212, the method includes removing the remaining portion of oxide 216 and removing oxide layer 210 overlying the NMOS region of device 200. During removal of the remaining portion of oxide layer 216 and removing oxide layer 210 overlying the NMOS region, a further small portion of the trench fill material of shallow trench isolation region 216 is also removed, for example, as shown in FIG. 23.

Figure 23:
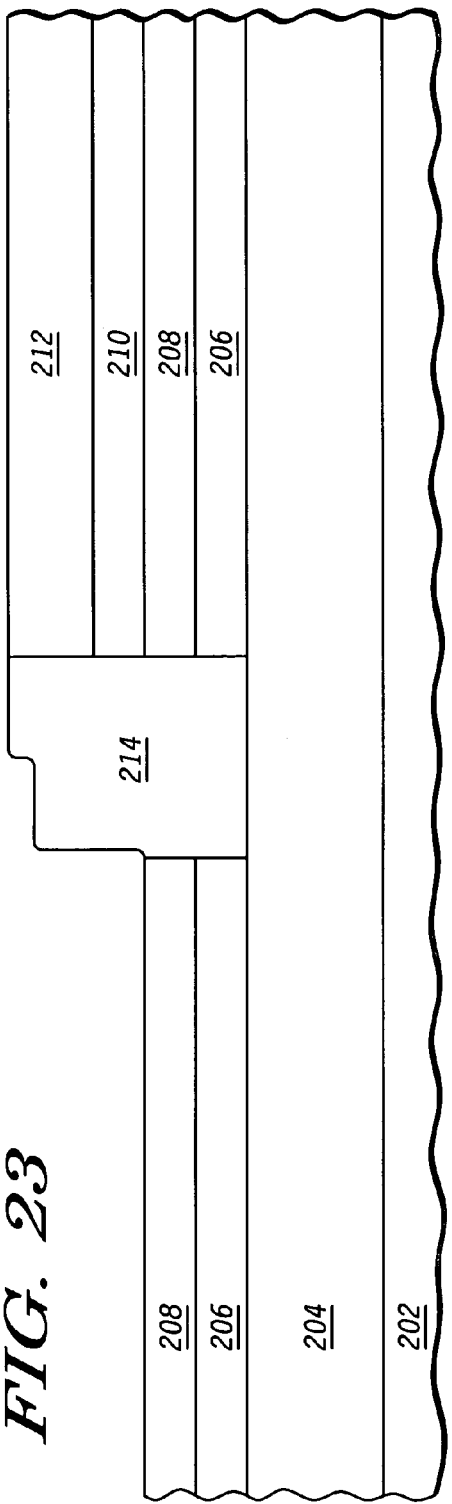
Figure 24:
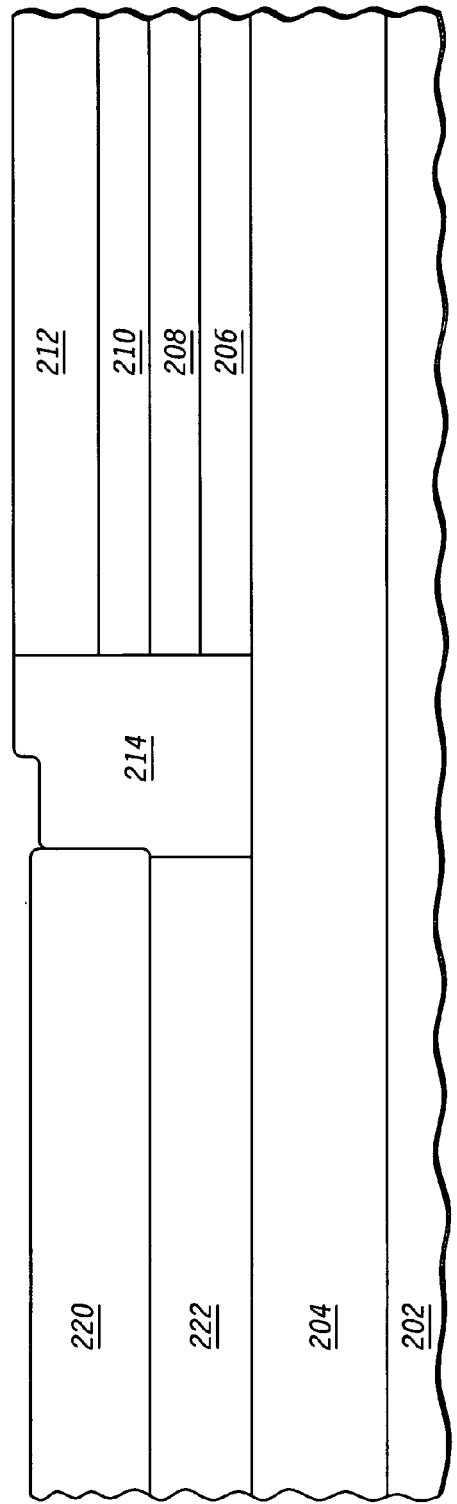

Referring now to FIGS. 23 and 24, the exposed c-SiGe layer 208 (FIG. 23) in the NMOS region is processed by condensation. Condensation provides a relaxed SiGe enriched layer 222 (FIG. 24) formed by a merging of layers 206 and 208, as well as growth of an oxide layer 220 overlying the NMOS region. In particular, layer 222 is a relaxed SiGe enriched layer having a thickness on the order of approximately 300 Angstroms. In one embodiment, oxide layer 220 has a thickness on the order of 600 Angstroms. During condensation and formation of the relaxed SiGe enriched layer 222, the nitride layer 212 overlying the PMOS region acts as a mask to provide protection to the underlying PMOS region.

Figure 25:
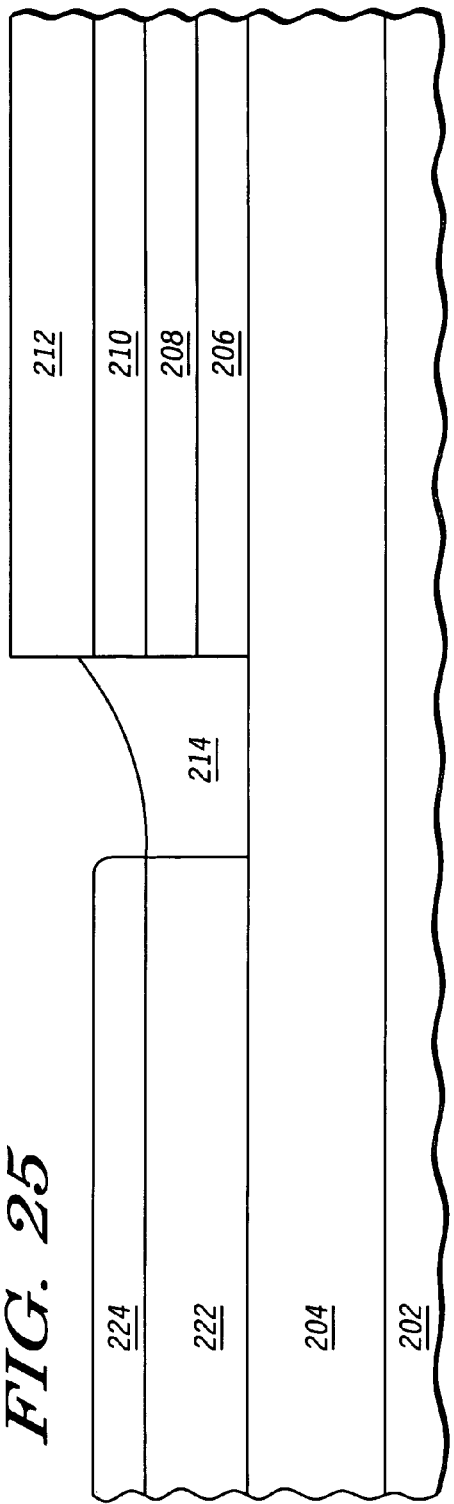

Following formation of relaxed SiGe enriched layer 222 in the NMOS region, oxide layer 220 is removed. During removal of oxide layer 220 overlying the NMOS region, a further portion of the trench fill material of shallow trench isolation 214 is also removed, for example, as shown in FIG. 25. Note that in FIG. 25, a remaining portion of shallow trench isolation 214 on the PMOS region side is slightly higher than oxide 210 to prevent any undesirable underetch condition, for example, with respect to layer 210, overlying the PMOS region. Subsequent to removal of oxide layer 220, a silicon cap layer is selectively grown over the relaxed SiGe enriched layer 222 in the NMOS region as indicated by reference numeral 224. Silicon cap layer 224 has a thickness on the order of 150-200 Angstroms.

Following growth of silicon cap layer 224, the nitride layer 212 overlying the PMOS region is removed by a suitable technique(s). Subsequent to removal of nitride layer 212, the method includes removing the remaining portion of oxide 210 overlying the PMOS region of device 200. During removal of the remaining portion of oxide layer 210, a further portion of the trench fill material of shallow trench isolation region 214 is also removed, for example, as shown in FIG. 26.

Subsequent to removal of oxide layer 210, an optional silicon cap layer is selectively grown over the silicon cap layer 224 in the NMOS region as indicated by reference numeral 226 and over the c-SiGe layer 208 in the PMOS region as indicated by reference numeral 228. The silicon cap layers 226 and 228 have biaxial, tensile strain. The silicon cap layer 228 has a first level of biaxial, tensile strain and the silicon cap layer 226 has a second level of biaxial, tensile strain, wherein the second level of biaxial, tensile strain is more than the first level of biaxial, tensile strain. Furthermore, silicon cap layers 226 and 228 have a thickness on the order of 50 Angstroms. Accordingly, another embodiment has been provided that enables a process for simultaneous performance enhancement for both NMOS and PMOS device structures.

Figure 26:
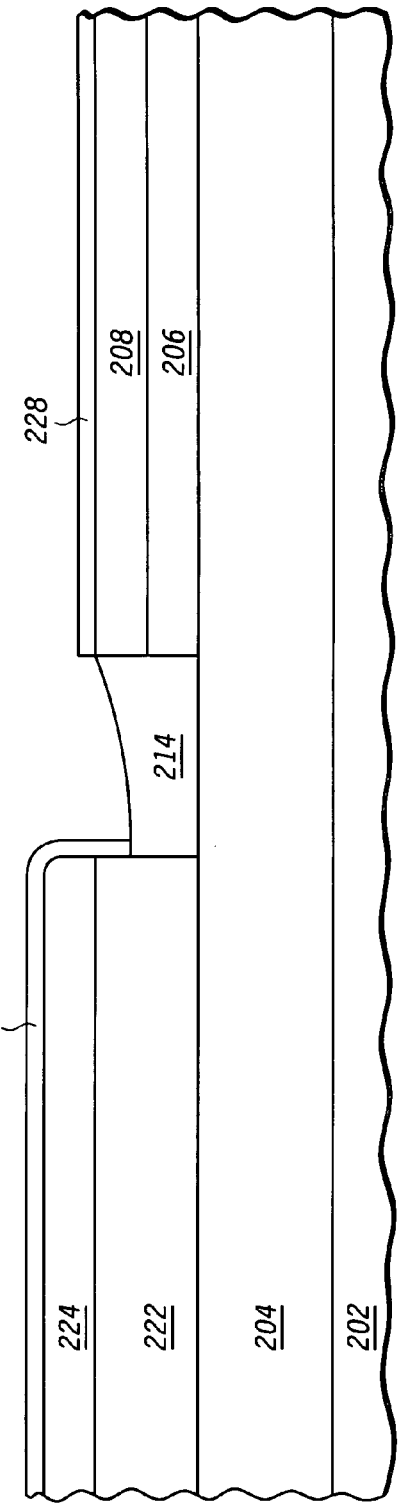

The structure as shown in FIG. 26 is then used to form NMOS and PMOS device structures, either simultaneously or separately, in the respective NMOS and PMOS regions, similarly as discussed herein above with respect to FIGS. 10 and 17. Formation of NMOS and PMOS device structures in the respective NMOS and PMOS regions can be accomplished using standard CMOS processing techniques. The NMOS device structure will have source/drain implant regions that extend through the Si cap layer 226, the t-Si layer 224, and the r-SiGe layer 222. The NMOS device structure will also have a device channel region that extends through the Si cap layer 226 and the t-Si layer 224. The PMOS device structure will have source/drain implant regions that extend through the Si cap layer 228, the c-SiGe layer 208, and the Si layer 206. In addition, the PMOS device structure will also have a channel region that extends through the biaxial, tensile Si layer 228 and c-SiGe layer 208, and the Si layer 206. Trench isolation 214 will separate and isolate the NMOS device from the PMOS device.

Figure 27:
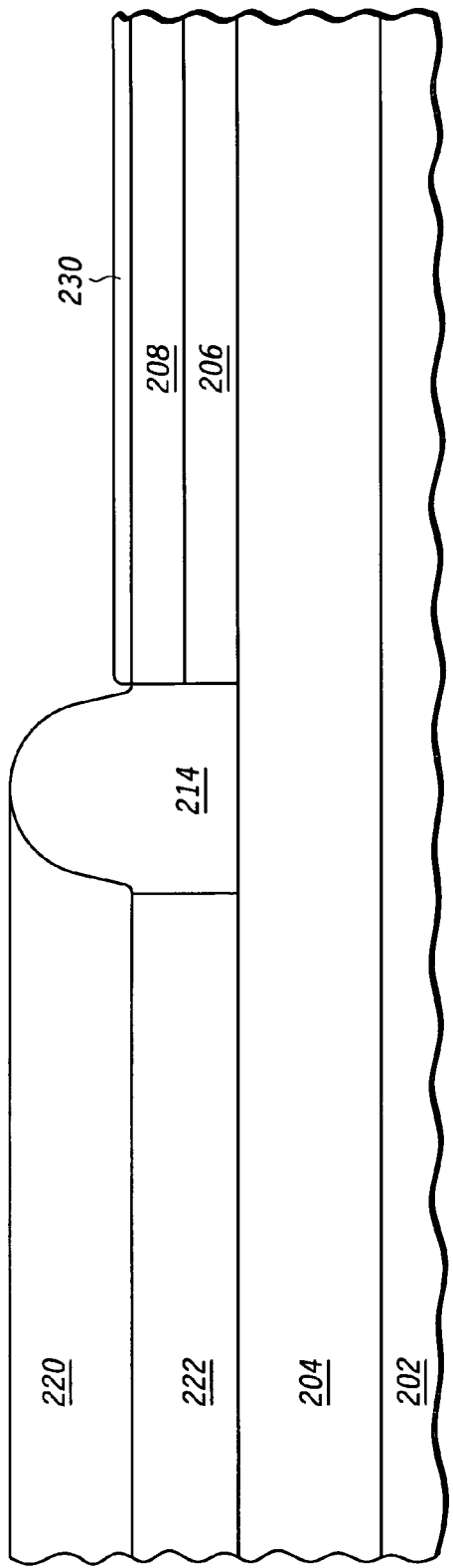
FIGS. 27-28 are partial cross-sectional views in a process of making a dual strained channel semiconductor CMOS device according to another embodiment of the present disclosure.
Figure 28:
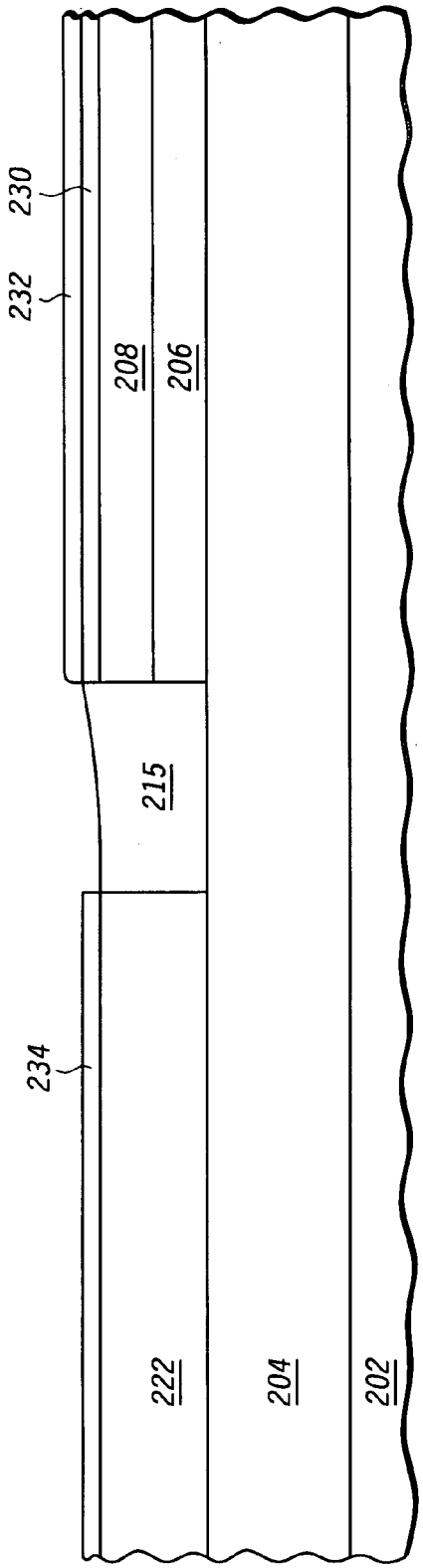

FIGS. 27-28 are cross-sectional views in a process of making a dual strained channel semiconductor CMOS device according to another embodiment of the present disclosure. Referring again to the structure of FIG. 24 and rather than proceeding in the method by removing the oxide 220, in another embodiment, the nitride layer 212 overlying the PMOS region is removed by a suitable technique(s) following formation of relaxed SiGe enriched layer 222 in the NMOS region. Subsequent to removal of nitride layer 212, the method includes removing the remaining portions of oxide 210 overlying the PMOS region of device 200. During removal of the remaining portion of oxide layer 210, a portion of the trench fill material of shallow trench isolation region 214 is also removed, as well a removing a portion of oxide layer 220, for example, as shown in FIG. 27. Following removal of oxide layer 210, a biaxially, compressive strained SiGe layer 230 is selectively deposited on c-SiGe layer 208 in the PMOS region. Compressively strained SiGe layer 230 has at thickness on the order of 150-200 Angstroms.

Subsequent to deposition of c-SiGe layer 230, the method includes removing the remaining portions of oxide 220 overlying the NMOS region of device 200. During removal of the remaining portion of oxide layer 220, a further portion of the trench fill material of shallow trench isolation region 214 is also removed, for example, as shown in FIG. 28. The remaining portion of the trench isolation region is indicated by reference numeral 215.

Subsequent to removal of oxide layer 220, a silicon cap layer is selectively grown over the relaxed SiGe enriched layer 222 in the NMOS region as indicated by reference numeral 234 and over the partially relaxed SiGe layer 230, layer 208, and layer 206 in the PMOS region as indicated by reference numeral 232. The silicon cap layers 232 and 234 have biaxial, tensile strain. The silicon cap layer 232 has a first level of biaxial, tensile strain and the silicon cap layer 234 has a second level of biaxial, tensile strain, wherein the second level of biaxial, tensile strain is more than the first level of biaxial, tensile strain. Furthermore, silicon cap layers 232 and 234 have a thickness on the order of 50 Angstroms. Accordingly, yet another embodiment has been provided that enables a process for simultaneous performance enhancement for both NMOS and PMOS device structures.

The structure as shown in FIG. 28 is then used to form NMOS and PMOS device structures, either simultaneously or separately, in the respective NMOS and PMOS regions, similarly as discussed herein above with respect to FIGS. 10 and 17. Formation of NMOS and PMOS device structures in the respective NMOS and PMOS regions can be accomplished using standard CMOS processing techniques. The NMOS device structure will have source/drain and extension implant regions that extend through the Si cap layer 234 and the r-SiGe layer 222. The NMOS device structure will also have a device channel region that extends through the Si cap layer 234. The PMOS device structure will have source/drain and extension implant regions that extend through the Si cap layer 232, the c-SiGe layer 230, the c-SiGe layer 208, and the Si layer 206. In addition, the PMOS device structure will also have a channel region that extends through Si cap layer 232 and into the c-SiGe layer 230. Trench isolation 215 will separate and isolate the NMOS device from the PMOS device.

With respect to the present embodiments, a dual channel approach with strained silicon on SOI provides for the combined advantages of SOI with strained Si for enhanced carrier mobility. For example, enhanced carrier mobility on the order of greater than 80% for NMOS and approximately 30% for PMOS can be achieved. In addition, a dual channel approach with compressed SiGe on SOI provides for the combined advantages of SOI with enhanced hole mobility, for example, on the order of two times (2×) higher than the universal mobility of conventional silicon devices.

Furthermore, with respect to the present embodiment, additional benefits over other approaches such as strained Si on bulk include, with the use of SOI, providing increased speed and/or reduced power consumption. For example, one embodiment of the present disclosure can provide at least a 15% increase in speed at a same standby power and an approximately 14% additional improvement in speed from the strained Si alone.

As described herein, the embodiments provide a solution for integrating NMOS and PMOS while taking advantage of the performance enhancement from strained Si and compressed SiGe simultaneously. In the method of the present embodiments, the process includes starting with the trench isolation module before performing condensation and/or selective epi. By defining the isolation trenches first, the integration is made simpler, for example, due to avoiding high temperature steps after channel regions are formed. While defining the trench isolation first is similar to a mesa approach in condensation, the mesa approach provides undesireably more relaxation in the SiGe during condensation.

As discussed herein, the shallow trench isolates the NMOS and PMOS active areas, and thus by masking the NMOS and PMOS active areas, condensation and/or selective epi can be performed separately. In the case where condensation is performed and further if a thick oxide is grown, then a standard CMP process can be used to remove the oxide at least down to the level of the trench. Accordingly, this is made possible by forming the trench first. Moreover, the present embodiments give flexibility to integrating NMOS and PMOS. Such flexibility is due to controlling the SiGe enrichment rate of the NMOS region without affecting the SiGe in the PMOS region. Still further, selective epi can be used for both NMOS and PMOS. Moreover, the embodiments of the present disclosure can be used advantageously for extending a CMOS roadmap in applications of high performance CMOS and low power CMOS. The embodiments also enable scaling down of device dimensions to take full advantage of SOI for fully depleted structures.

Furthermore, the embodiments provide a solution for optimizing NMOS and PMOS channels to benefit from tensile strained Si and compressed SiGe simultaneously. The embodiments avoid high thermal budget steps, resulting for example in less Ge inter-diffusion and strain relaxation. The embodiments also allow for inserting channels only in desired areas, thus minimizing integration issues. The embodiments also provide flexibility in controlling SiGe enrichment rate/strain by using selective condensation as well as selective epi. In addition, the embodiments further allow optimization of one channel without affecting the other.

In the foregoing specification, the disclosure has been described with reference to various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a semiconductor device comprising:

forming trench isolation in a wafer to separate an NMOS region from a PMOS region of the wafer, the wafer having a semiconductor on insulator (SOI) configuration that comprises a semiconductor layer over an insulator, wherein the trench isolation extends at least to the insulator through the semiconductor layer;

forming a first channel region in the NMOS region, the first channel region having a first strain characteristic; and forming a second channel region in the PMOS region, the second channel region having a second strain characteristic, wherein the second strain characteristic is less tensile than the first strain characteristic and wherein the first and second strain characteristics enable a simultaneous performance enhancement in NMOS and PMOS device structures to be formed in respective NMOS and PMOS regions, wherein prior to forming the isolation trench, the method further comprising:

forming a protective layer overlying the semiconductor layer; and forming a nitride layer overlying the protective layer, wherein the trench isolation extends at least to the insulator through the nitride layer, the protective layer, and the semiconductor layer.

2. The method of claim 1, further comprising:

forming a hardmask overlying the nitride layer in the NMOS region and a portion of the trench isolation; and removing the nitride layer in the PMOS region to expose the underlying protective layer in the PMOS region, wherein the hardmask prevents removal of the nitride layer in the NMOS region during the removing of the nitride layer in the PMOS region.

3. The method of claim 2, wherein forming the hardmask overlying the nitride layer in the NMOS region and a portion of the trench isolation comprises:
forming a hardmask overlying (i) the nitride layer in the NMOS region, (ii) the trench isolation, and (iii) the nitride layer in the PMOS region; and
patterning and etching the hardmask to remove the hardmask overlying the nitride layer in the PMOS region and a portion of the trench isolation adjacent the PMOS region.

4. The method of claim 2, further comprising:
simultaneously removing (i) the hardmask overlying the nitride layer in the NMOS region and the portion of the trench isolation and (ii) the protective layer overlying the semiconductor layer in the PMOS region; and
forming a silicon germanium layer overlying the semiconductor layer in the PMOS region, wherein the silicon germanium layer comprises a biaxially compressed strained silicon germanium layer having a thickness less than a critical thickness required to remain a biaxially compressed strained layer, and wherein the nitride layer in the NMOS region acts as a mask to protect the underlying semiconductor layer in the NMOS region during formation of the silicon germanium layer overlying the semiconductor layer in the PMOS region.

5. The method of claim 4, wherein forming the silicon germanium layer overlying the semiconductor layer comprises one of (i) selectively growing the silicon germanium layer with a first germanium concentration to a desired thickness less than a critical thickness required for the silicon germanium layer to remain a biaxially compressed strained layer or (ii) selectively growing the silicon germanium layer with a second germanium concentration to a greater thickness and then condensing the selectively grown silicon germanium layer without relaxation to obtain a biaxially compressed strained layer, wherein the first germanium concentration is higher than the second germanium concentration.

6. The method of claim 4, further comprising:
selectively growing a silicon cap layer overlying the biaxially compressed stained silicon germanium layer, wherein the silicon cap layer is not strained.

7. The method of claim 4, further comprising:
removing the nitride layer in the NMOS region;
removing the protective layer in the NMOS region; and
forming NMOS and PMOS device structures in respective NMOS and PMOS regions.

8. The method of claim 4, further comprising:
removing the nitride layer in the NMOS region;
removing the protective layer in the NMOS region; and
selectively growing a silicon cap layer overlying the biaxially compressed stained silicon germanium layer in the PMOS region and overlying the semiconductor layer in the NMOS region, wherein the silicon cap layer overlying the biaxially compressed stained silicon germanium layer in the PMOS region has a first level of biaxial, tensile strain and wherein the silicon cap layer overlying the semiconductor layer in the NMOS region has a second level of biaxial, tensile strain, wherein the second level of biaxial, tensile strain is more than the first level of biaxial, tensile strain.

9. The method of claim 8, further comprising:
forming an NMOS device structure in the NMOS region; and
forming a PMOS device structure in the PMOS region, wherein the method achieves simultaneous enhancement in NMOS and PMOS device performance.

10. A method of forming a semiconductor device comprising:
forming trench isolation in a wafer to separate an NMOS region from a PMOS region of the wafer, the wafer having a semiconductor on insulator (SOI) configuration that comprises a semiconductor layer over an insulator, wherein the trench isolation extends at least to the insulator through the semiconductor layer;
forming a first channel region in the NMOS region, the first channel region having a first strain characteristic; and
forming a second channel region in the PMOS region, the second channel region having a second strain characteristic, wherein the second strain characteristic is less tensile than the first strain characteristic and wherein the first and second strain characteristics enable a simultaneous performance enhancement in NMOS and PMOS device structures to be formed in respective NMOS and PMOS regions,
wherein the semiconductor layer comprises one selected from the group consisting of (i) biaxial, tensile strained silicon, (ii) relaxed silicon germanium, (iii) partially relaxed silicon germanium, and (iv) compressively strained silicon germanium overlying silicon.

11. The method of claim 1, further comprising:
forming a hardmask overlying the nitride layer in the PMOS region and a portion of the trench isolation; and
removing the nitride layer in the NMOS region to expose the underlying protective layer in the NMOS region, wherein the hardmask prevents removal of the nitride layer in the PMOS region during the removing of the nitride layer in the NMOS region.

12. The method of claim 11, wherein forming the hardmask overlying the nitride layer in the PMOS region and a portion of the trench isolation comprises:
forming a hardmask overlying (i) the nitride layer in the NMOS region, (ii) the trench isolation, and (iii) the nitride layer in the PMOS region; and
patterning and etching the hardmask to remove the hardmask overlying the nitride layer in the NMOS region and a portion of the trench isolation adjacent the NMOS region.

13. The method of claim 11, further comprising:
simultaneously removing (i) the hardmask overlying the nitride layer in the PMOS region and the portion of the trench isolation and (ii) the protective layer overlying the semiconductor layer in the NMOS region; and
relaxing the semiconductor layer in the NMOS region by condensation to form a relaxed semiconductor layer in the NMOS region, wherein the nitride layer in the PMOS region acts as a mask to protect the underlying semiconductor layer in the PMOS region during the relaxing of the semiconductor layer in the NMOS region.

14. The method of claim 13, wherein the semiconductor layer comprises a partially relaxed silicon germanium layer and wherein the relaxed semiconductor layer in the NMOS region comprises a relaxed silicon germanium layer, further wherein the relaxed silicon germanium layer is more relaxed than the partially relaxed silicon germanium layer in the NMOS region.

15. The method of claim 13, wherein the semiconductor layer comprises a compressively strained silicon germanium layer overlying a silicon layer, and wherein relaxing the semiconductor layer in the NMOS region by condensation provides a relaxed silicon germanium enriched layer formed by merging of the compressively strained silicon germanium layer with the underlying silicon layer, wherein the relaxed silicon germanium enriched layer is more relaxed than the initial semiconductor layer in the NMOS region.

16. The method of claim 13, further comprising:
removing the nitride layer in the PMOS region;
removing the protective layer in the PMOS region; and
selectively growing an optional silicon cap layer overlying the semiconductor layer in the PMOS region and overlying the relaxed semiconductor layer in the NMOS region, wherein the silicon cap layer overlying the semiconductor layer in the PMOS region has a first level of biaxial, tensile strain and wherein the silicon cap layer overlying the relaxed semiconductor layer in the NMOS region has a second level of biaxial, tensile strain, wherein the second level of biaxial, tensile strain is more than the first level of biaxial, tensile strain.

17. The method of claim 13, further comprising:
forming a silicon cap layer over the relaxed silicon germanium enriched layer in the NMOS region;
removing the nitride layer in the PMOS region;
removing the protective layer in the PMOS region; and
selectively growing an optional silicon cap layer overlying the semiconductor layer in the PMOS region and overlying the silicon cap layer in the NMOS region, wherein the optional silicon cap layer overlying the semiconductor layer in the PMOS region has a first level of biaxial, tensile strain and wherein the optional silicon cap layer overlying the silicon cap layer in the NMOS region has a second level of biaxial, tensile strain, wherein the second level of biaxial, tensile strain is more than the first level of biaxial, tensile strain.

18. The method of claim 13, further comprising:
removing the nitride layer in the PMOS region;
removing the protective layer in the PMOS region; and
selectively depositing a biaxially, compressive strained silicon germanium layer onto the semiconductor layer in the PMOS region.

19. The method of claim 18, further comprising:
selectively growing a silicon cap layer overlying the biaxially, compressive strained silicon germanium layer in the PMOS region and overlying the relaxed semiconductor layer in the NMOS region, wherein the silicon cap layer overlying the biaxially, compressive strained silicon germanium layer in the PMOS region has a first level of biaxial, tensile strain and wherein the silicon cap layer overlying the relaxed semiconductor layer in the NMOS region has a second level of biaxial, tensile strain, wherein the second level of biaxial, tensile strain is more than the first level of biaxial, tensile strain.

* * * * *